(12) United States Patent
Kuznetsov

(10) Patent No.: US 11,356,080 B2
(45) Date of Patent: *Jun. 7, 2022

(54) ENERGY STORAGE MODULE WITH XRAM CURRENT MULTIPLIER

(71) Applicant: Raytheon Company, Waltham, MA (US)

(72) Inventor: Stephen Kuznetsov, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/204,005

(22) Filed: Mar. 17, 2021

(65) Prior Publication Data

US 2021/0218390 A1 Jul. 15, 2021

Related U.S. Application Data

(63) Continuation of application No. 16/738,184, filed on Jan. 9, 2020, now Pat. No. 10,958,254.

(51) Int. Cl.
 *H02J 3/00* (2006.01)
 *H03K 3/57* (2006.01)
(52) U.S. Cl.
 CPC ..................... *H03K 3/57* (2013.01)
(58) Field of Classification Search
 CPC ................... H03K 3/57; H02J 3/00
 USPC ......................................................... 307/72
 See application file for complete search history.

(56) References Cited

U.S. PATENT DOCUMENTS

| 7,495,357 | B2 * | 2/2009 | Brommer | H03K 3/57 |
| | | | | 307/106 |
| 9,837,996 | B2 * | 12/2017 | Kuznetsov | H02J 1/16 |
| 10,298,212 | B2 * | 5/2019 | Kuznetsov | H03K 3/45 |
| 10,958,254 | B1 * | 3/2021 | Kuznetsov | H02K 7/025 |

(Continued)

FOREIGN PATENT DOCUMENTS

DE    10 2005 014043    10/2006

OTHER PUBLICATIONS

International Search Report and Written Opinion dated Jul. 19, 2021 in corresponding International Application No. PCT/US2020/067242.

(Continued)

*Primary Examiner* — Ryan Jager
(74) *Attorney, Agent, or Firm* — Renner, Otto, Boisselle & Sklar, LLP

(57) ABSTRACT

An electrical machine includes as part of its stator XRAM windings for multiplying current output of the machine. The XRAM windings are coupled to switching elements that are configured to produce current multiplication for output to an external load. The XRAM windings may be in slots in the stator, or may be elsewhere in the stator, operatively coupled to other windings in the stator. The stator may be operatively coupled to a rotor and hence to an inertial energy source, such as a flywheel on the same shaft as the elements of the electrical machine. Short circuiting of select windings of the machine can advantageously cause a shifting and concentration of a machine airgap flux of the machine over other windings, and increasing their magnetic storage energy.

20 Claims, 16 Drawing Sheets

(56) References Cited

U.S. PATENT DOCUMENTS

2013/0285491 A1* 10/2013 Kuznetsov ............ H02M 5/271
                                                      310/71
2019/0036336 A1*  1/2019 Kuznetsov ............ H02J 7/1423

OTHER PUBLICATIONS

Invitation to Pay Additional Fees dated Apr. 23, 2021 in corresponding International Application No. PCT/US2020/067242.

* cited by examiner

VVF = VARIABLE-VOLTAGE VARIABLE FREQUENCY CONVERTER

ENERGY STORAGE MODULE WITH XRAM CURRENT MULTIPLIER

This is a continuation of U.S. application Ser. No. 16/738,184, filed Jan. 9, 2020, issued as U.S. Pat. No. 10,958,254. The above application is incorporated by reference in its entirety.

FIELD OF THE INVENTION

The invention is the field of pulsed power systems for transferring power.

DESCRIPTION OF THE RELATED ART

Power conversion using the XRAM circuit techniques are known in the prior art for producing a current multiplication of a generator or source output to permit very high current supplied to mainly pulsed electromagnetic loads. These circuits employ a multiplicity of solid state or triggered vacuum switches which quickly reconnect internal energy storage elements within the XRAM generator to reconfigure a circuit by placing series charged energy storage elements in parallel to effect a current multiplication. For example, in a 10-stage XRAM generator if there are 10 elements which are charged in series at 10 kV input these elements are placed in parallel to yield a 1 kV output at 10 times the current rating of the individual elements. In one prior art embodiment, the energy storage elements are inductive storage coils. This system has been shown to be effective and implemented in prior art although heavy and of low power density. This prior art requires the energy storage elements to be outside of the main generator or source and consequently require significant extra space and weight for the XRAM generator.

SUMMARY OF THE INVENTION

An electrical machine includes stator windings that function as an XRAM generator.

An electrical machine includes in its stator slots motoring windings, generating (main output) windings, and XRAM windings.

An electrical machine includes XRAM windings in a stator that are operatively coupled to other windings in slots of the stator.

According to an aspect of the invention, a dynamo-electric machine includes: an electromagnetic structure that includes: alternating current primary windings; and polyphase secondary windings; an array of switching elements; and a flywheel rotating mass; wherein the primary windings provide a motoring torque on the flywheel rotating mass and magnetize the dynamo-electric machine; wherein the electromagnetic structure provides power, derived from transient electromagnetic inductive storage within the electromagnetic structure, to the array of switching elements, with the switching elements configured to produce current multiplication for output to an external load; and wherein the flywheel rotating mass is operatively coupled to the electromagnetic structure to provide inertial energy storage.

According to an embodiment of any paragraph(s) of this summary, the machine further includes tertiary windings operatively coupled to the primary windings and the secondary windings.

According to an embodiment of any paragraph(s) of this summary, the secondary windings provide output power.

According to an embodiment of any paragraph(s) of this summary, the tertiary windings provide inductive energy storage.

According to an embodiment of any paragraph(s) of this summary, in operation the tertiary windings are configurable in a series connection for energy storage, and are reconfigurable in a parallel connection.

According to an embodiment of any paragraph(s) of this summary, the machine further includes tertiary windings operatively coupled to the primary windings and the secondary windings such that short circuiting of the primary windings or the secondary windings causes a shifting and concentration of a machine airgap flux of the machine over tertiary windings, which induces a direct or transient current in the tertiary windings, which is used for inductive energy storage and to effect a current multiplication to the external load.

According to an embodiment of any paragraph(s) of this summary, the short circuiting of the primary windings or the secondary windings causes a shifting or concentration of the machine airgap flux from a direct magnetic axis to a quadrature magnetic axis.

According to an embodiment of any paragraph(s) of this summary, the machine contains additional electromagnetic windings arranged to produce a counter-pulse output for the purpose of commutating high power electronic switches that are principally used to reconfigure the tertiary winding coils contained within the machine periphery into a high current array and to provide a high current output to the external load that is operatively coupled to the machine.

According to an embodiment of any paragraph(s) of this summary, there are three or more distinct levels of airgap radially-directed magnetic flux over a repeatable section of the airgap periphery, with the primary windings and the secondary windings magnetically coupled by a first level flux density, and the tertiary windings coils coupled by a second level of flux density, and counter-pulse coils that are coupled by a third level of flux density.

According to an embodiment of any paragraph(s) of this summary, magnitude and phase shift of the second flux level and the third flux level are enhanced by means of short-circuit coils embedded in a stator magnetic core of the machine.

According to an embodiment of any paragraph(s) of this summary, magnitude and phase shift of the second flux level and the third flux level are enhanced by means of short-circuit coils embedded in a rotor magnetic core of the machine.

According to an embodiment of any paragraph(s) of this summary, the machine further includes tertiary windings operatively coupled to the primary windings and the secondary windings such that short circuiting of the primary windings or the secondary windings causes a shifting or concentration of core magnetic flux of the machine, and subsequently increases the magnetic energy storage capacity of the tertiary windings, which is used for rapid transfer of inductive energy storage and in conjunction with a switching network effects a current multiplication to power output loads.

According to an embodiment of any paragraph(s) of this summary, the machine further includes tertiary windings operatively coupled to the primary windings and the secondary windings such that short circuiting of the primary windings or the secondary windings causes a pulsing of core magnetic flux of the machine, and subsequently increases the magnetic energy storage capacity of the tertiary windings, which is used for rapid transfer of inductive energy storage and in conjunction with a switching network effects a current multiplication to power output loads.

According to an embodiment of any paragraph(s) of this summary, the flywheel rotating mass is on a same shaft as other elements of the machine.

According to another aspect of the invention, an electrical machine includes: a stator; a rotor; and windings in the stator; wherein the stator surrounds the rotor; wherein the windings in the stator include: main windings for producing output current; and pulsed winding coils configured for producing a multiplied output that is greater than the output current.

According to an embodiment of any paragraph(s) of this summary, the machine is a doubly-fed induction machine configured to receive power inputs to both the rotor and the stator.

According to an embodiment of any paragraph(s) of this summary, the main windings and the pulsed winding coils are in alternate slots of the stator, and drive different respective magnetic circuits.

According to an embodiment of any paragraph(s) of this summary, the pulsed winding coils are radially inward of the main windings, with the pulsed winding coils closer than the main windings to an airgap between the stator and the rotor.

According to an embodiment of any paragraph(s) of this summary, the machine further includes counter-pulse coils on an outer periphery of a stator magnetic core of the stator.

According to an embodiment of any paragraph(s) of this summary, the counter-pulse coils have independent magnetic circuits used primarily for energy storage in a magnetic field.

According to an embodiment of any paragraph(s) of this summary, the counter-pulse coils provide commutation energy for power electronic switches connected to the machine, where the power electronic switches require reverse bias to accomplish commutation.

According to an embodiment of any paragraph(s) of this summary, the main windings in the stator include polyphase motoring coils and polyphase generating coils.

According to an embodiment of any paragraph(s) of this summary, the pulsed winding coils are polyphase coils wound and concentrated in a quadrature axis of the machine; wherein the generating coils are wound and concentrated in a direct axis of the machine; and wherein the motoring coils span both the direct axis and the quadrature axis.

According to an embodiment of any paragraph(s) of this summary, simultaneous short circuiting of the motoring coils and of rotor windings of the rotor causes a peripheral shift in airgap magnetic flux to the generating coils or the pulsed winding coils.

According to an embodiment of any paragraph(s) of this summary, short circuiting of rotor windings of the rotor and open circuiting of the motoring coils provides flux shifting to enhance voltage induction into the generating coils or the pulsed winding coils.

According to an embodiment of any paragraph(s) of this summary, the pulsed winding coils are outside of slots of the stator that contain the main windings.

According to an embodiment of any paragraph(s) of this summary, the pulsed winding coils have an independent voltage level different from that of the main windings.

According to an embodiment of any paragraph(s) of this summary, the machine further includes auxiliary coils coupling the pulsed winding coils with the main windings.

According to an embodiment of any paragraph(s) of this summary, the machine further includes magnetic pole pieces operatively coupled to the pulsed winding coils, which are separated the machine main magnetic core.

According to an embodiment of any paragraph(s) of this summary, the main windings include generating windings that are operatively coupled to a rectifier to selectively store energy in the pulsed winding coils, to allow selective high-current output from the pulsed winding coils.

According to an embodiment of any paragraph(s) of this summary, the high-current output is greater than an output of the generating windings.

According to an embodiment of any paragraph(s) of this summary, the high-current output is a multiple of the output of the generating windings.

According to an embodiment of any paragraph(s) of this summary, the machine further includes counter-pulse coils in the stator, having independent magnetic circuits.

According to an embodiment of any paragraph(s) of this summary, the machine further includes a switch for shorting between motoring windings of the stator, and a rotor winding of the rotor.

According to a further aspect, a system includes: two or more electrical machines operatively coupled together; wherein outputs of the two or more machines are combinable to power a common load; wherein each of the machines is configured to have a different respective shaft speed and/or a different stored energy capability; and wherein the machines are coupled together for sequential or parallel feeds from the machines.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the invention.

DETAILED DESCRIPTION

An electrical machine includes as part of its stator XRAM windings for multiplying current output of the machine. The XRAM windings are coupled to switching elements that are configured to produce current multiplication for output to an external load. The XRAM windings may be in slots in the stator, or may be elsewhere in the stator, operatively coupled to other windings in the stator. The stator may be operatively coupled to a rotor and hence to an inertial energy source, such as a flywheel on the same shaft as the elements of the electrical machine. Short circuiting of select windings of the machine can advantageously cause a shifting and concentration of a machine airgap flux of the machine over other windings, and increasing their magnetic storage energy.

Other arrangements are possible based on the principles described below in connection with certain embodiments. For example the arrangements shown herein can be inverted, whereby primary, secondary, and tertiary windings are on the rotor and excitation windings are on the stator.

Various embodiments described herein include motoring windings, generating windings, and XRAM or counter-pulse (CP) windings. Alternatively the motoring windings may be considered primary windings, the generating windings may be considered secondary windings, and the XRAM or CP windings may be considered tertiary windings.

In general, an electrical machine has a primary winding, typically on stator, that is distributed in both direct and quadrature axes. The secondary winding also typically on the stator is concentrated on the direct axis. The tertiary winding also on the stator is concentrated on the quadrature axis. During the mode when output system requires the tertiary winding to be used for either energy storage or counter-pulse generation, the airgap flux is shifted by several means from peaking in the direct axis to peaking in the quadrature axis and consequently the voltage induced in the tertiary winding advantageously escalates beyond normal values.

One such means is to short-circuit the primary winding at its terminals (with power source removed) which shifts airgap flux from the peripheral stator segment occupied by the primary winding to the tertiary or counter-pulse peripheral zone. Another means is to short circuit the terminals of wound polyphase rotor which has the effect of shifting airgap flux to peak in the stator quadrature axis of the tertiary winding. A third means is to employ short-circuiting "null flux" closed loops at various peripheral positions along the stator core which are controlled to create a terminal short circuit on these loops by a set of solid-state switches or vacuum circuit breakers. The magnetic flux through a short-circuited closed loop is low or close to zero and this causes airgap flux to shift peripheral position to where it peaks.

Figure 1:
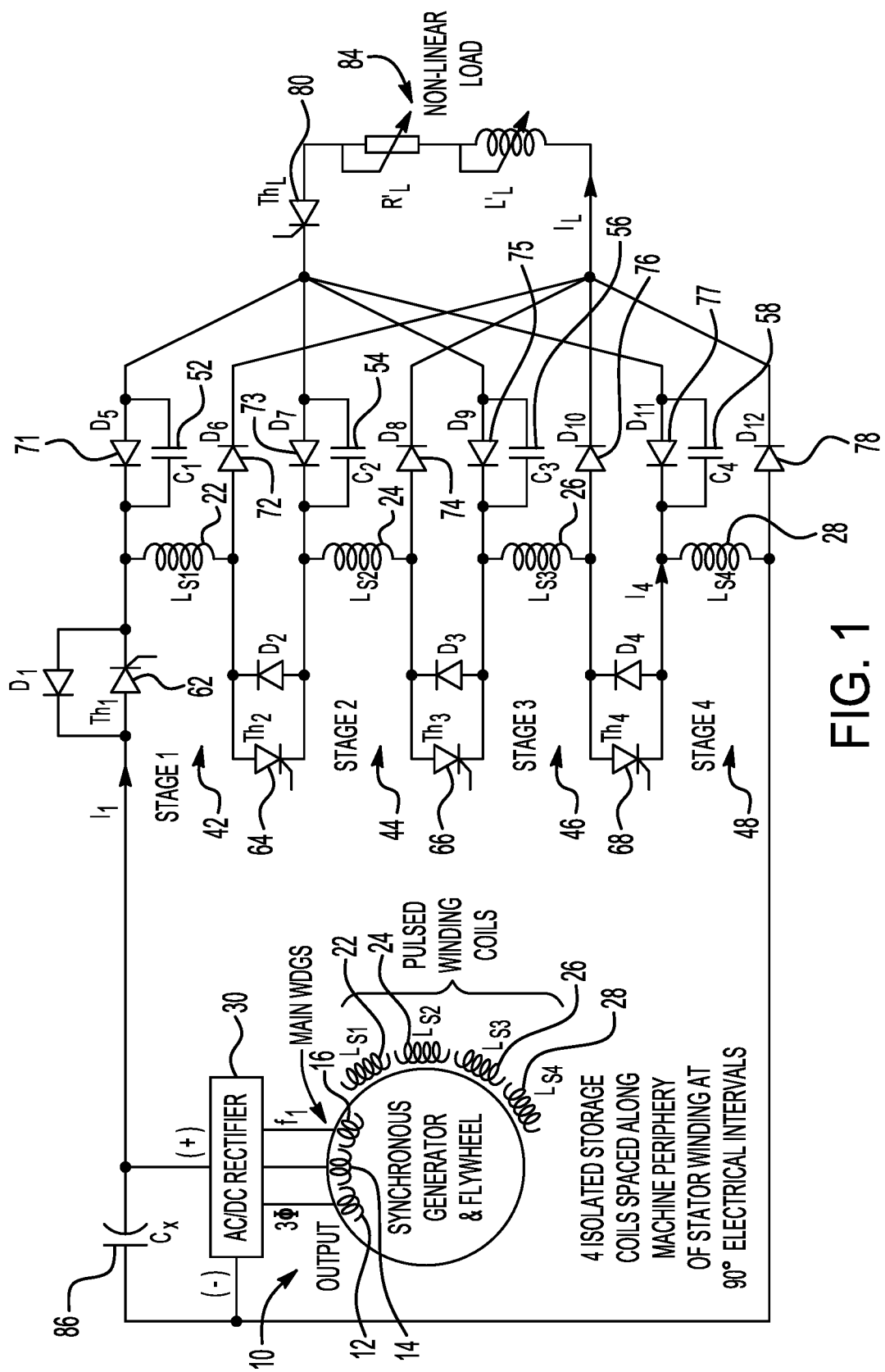
FIG. 1 is a schematic diagram of a power transfer system or machine in accordance with an embodiment of the invention.

FIG. 1 shows a synchronous electrical machine 10 with two sets of stator windings for providing both a) main pulse output power, and b) integrated inductive storage coils fitted around the stator periphery which serve to function in the XRAM switching circuit for the current multiplication. The two magnetic circuits are functionally decoupled in actual operation since the main and XRAM windings are in use at separate times although share a common magnetic circuit. A prime mover provides mechanical input power to the electrical machine and flywheel.

The windings include main windings 12, 14, and 16, and secondary windings 22, 24, 26, and 28. The secondary windings 22-28 are shown as part of the electrical machine 10, and also are shown as part of the circuit diagram at the right side of FIG. 1. In FIG. 1 the secondary windings 22-28 are shown both in the left side of the figure as part of the electrical machine 10, and in the right side of the figure, which shows a functional circuit diagram indicating the interconnection between the secondary windings 22-28 in their use for energy storage and current multiplication, as an XRAM circuit.

XRAM circuit techniques can be used for producing a current multiplication of a generator or source output to permit very high current supplied to mainly pulsed electromagnetic loads. Such XRAM circuits use multiple solid state or triggered vacuum switches that quickly reconnect internal energy storage elements within an XRAM generator to reconfigure a circuit by for placing series charged energy storage elements ($Ls_1$-$Ls_4$, shown as the coils 22-28) in parallel to effect a current multiplication. The number of stages/elements and the corresponding amount of multiplication of current may take on any of a variety of values. For example, in a ten-stage XRAM generator if there are 10 elements that are charged in series at 10 kV input, these elements may be placed in parallel to yield a 1 kV output at ten times the current rating of the individual elements. The secondary windings 22-28 themselves are configured to function as the individual elements of an XRAM generator, and distributed around the machine periphery, e.g. at 90 degree electrical spacing.

The main windings 12-16 produce polyphase AC output at a high voltage and low current. This polyphase high-voltage low-current AC output is rectified to high-voltage low-current DC by a rectifier 30. This DC current is used to charge the input stages to the four XRAM stages 42, 44, 46, and 48, each one corresponding to one of the secondary windings 22-28. The arrangement shown includes inductive storage coils $Ls_1$-$Ls_4$ (the secondary windings 22-28) and counter-pulsed by electrostatic capacitors $C_1$-$C_4$ (reference numbers 52, 54, 56, and 58) for the internal energy storage elements. The four-stage XRAM is shown along with four main reverse conducting thyristors (RCT) 62, 64, 66, and 68, and eight power diodes 71, 72, 73, 74, 75, 76, 77, and 78. The final output switch 80 can be a thyristor or similar high current switching device such as a triggered vacuum switch. Output is provided to a load 84, which may be a non-linear load.

In one embodiment the synchronous machine 10 is a wound-field electrical generator. The main stator windings 12-16 are energized first by a DC excitation winding on the rotor. The output from the main stator windings 12-16 is used after AC/DC rectification in the rectifier 30 (and capacitive storage capacitor intermediate storage 86) to inductively charge the "N" (e.g., 4) storage coils 22-28 that are in series connection, with DC current $I_1$. The thyristors $Th_1$-$Th_4$ (reference numbers 62-68) are gated to conduct forward current to charge the inductor elements 22-28 and share the source voltage equally. When the inductors 22-28 reach the steady state value of current, then a load switch thyristor $Th_L$ (reference number 80) is closed, and all the "N" storage coils (the secondary coils 22-28) are in parallel, and output current $I_1$ has been multiplied by a factor of N:1.

Reference is at times made herein to a machine having N storage coils. In such references it should be appreciated that N represents any integer greater than 1.

This current-multiplication process also works with a permanent-magnet field synchronous AC generator that has a nearly constant airgap flux at all times, and may be superior to a wound-DC field machine, which can have greater variation in magnitude of airgap flux. In such an alternative arrangement the AC/DC rectifier has an intermediate energy storage with an electrostatic capacitor bank. Since the voltage is high at this stage, the capacitor bank is compact and efficient. Energy transfer is from the flywheel through the electrical machine then to the DC rectifier capacitor then routed to the inductive storage coils mounted on the machine periphery. Thus there are three distinct mechanisms of energy storage.

Figure 2:
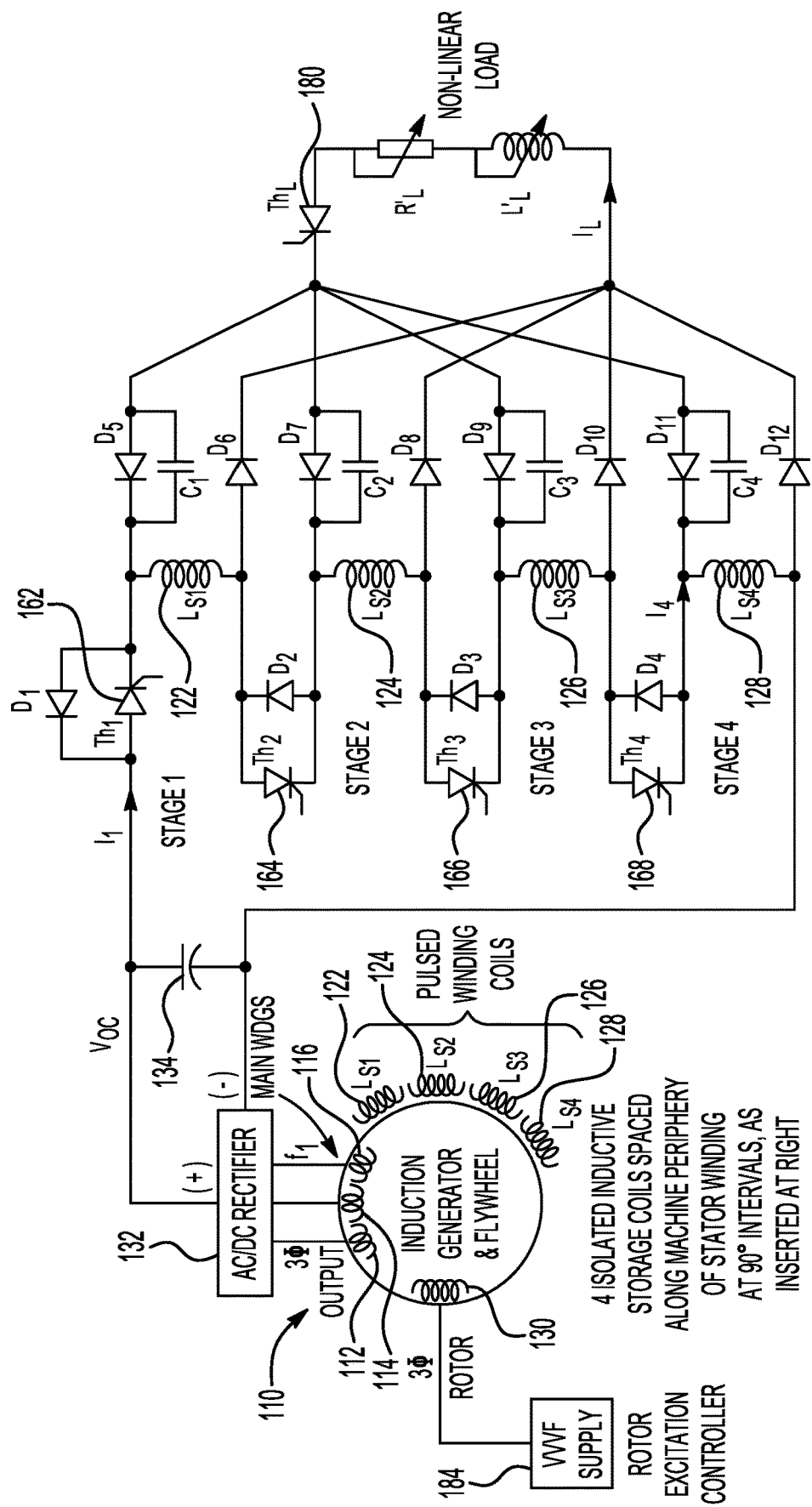
FIG. 2 is a schematic diagram of a power transfer system or machine in accordance with an embodiment of the invention.

FIG. 2 shows a simplified arrangement of using a wound field induction electrical machine 110 with two sets of stator windings for providing both main pulse output power, using the main windings 112, 114, and 116, and integrated inductive storage coils 122, 124, 126, and 128, fitted around a stator periphery. The secondary windings (inductive storage coils) 122-128 serve to function in the XRAM switching circuit for the current multiplication. The two magnetic circuits are functionally decoupled in actual operation since the main windings 112-116 and the XRAM windings 122-128 are in use at separate times, although both sets of windings share a common magnetic circuit.

Consider the operation of an induction machine that is a polyphase wound-AC field induction generator and is already up to speed with a significant flywheel for energy storage. The main stator windings 112-116 are energized first by an AC excitation slip-frequency rotor winding 130 and associated power supply 184. The stator-generated output is used after AC/DC rectification (in a rectifier 132), and after capacitive storage capacitor intermediate storage 134, to inductively charge the "N" (e.g. 4) storage coils 122-128. The coils 122-128 are charged in series connection through thyristors $Th_1$-$Th_4$ (reference numbers 162, 164, 166, and 168) with DC current. When the inductors reaches the steady-state value of current, then load switch thyristor $Th_L$ (reference number 180) is closed and all "N" storage coils $Ls_1$-$Ls_N$ (the secondary coils 122-128 in the illustrated embodiment) are in parallel and output current has been multiplied by a factor of N:1. A variable-voltage variable-frequency (VVVF) power supply 184 powering the rotor circuit 130 also has the ability to curtail active excitation and short-circuit the rotor winding(s) 130 to benefit the overall scheme. This lowers the impedance of the secondary coils, which is advantageous. When the storage inductors (the secondary coils 122-128) are charged to full rated current and main output winding current is near zero, the rotor winding(s) are short circuited at their terminals by either the VVVF drive 184 or a separate shorting switch (or vacuum breaker), and the machine airgap flux will peripherally shift and create a DC transient component of current in each storage coil in addition to the first DC current. Energy transfer is from the flywheel through the electrical machine then to the DC rectifier capacitor (for short time period) then routed to the inductive storage coils 122-128 mounted on the machine periphery.

Figure 3:
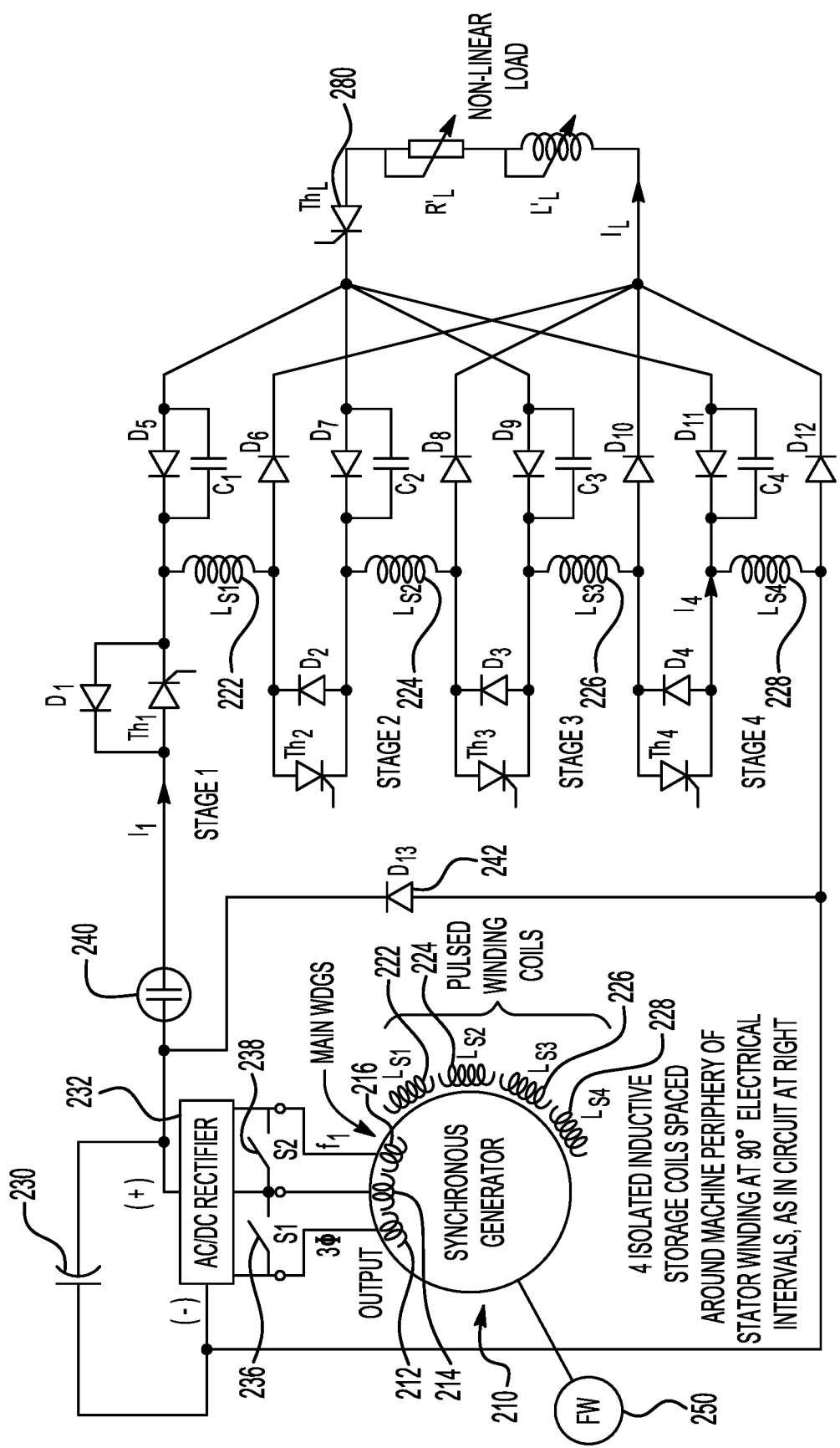
FIG. 3 is a schematic diagram of a power transfer system or machine in accordance with an embodiment of the invention.

FIG. 3 shows an embodiment in which a synchronous electrical machine 210 has two sets of stator windings that include main windings 212, 214, and 216, for providing main pulse output power, and integrated inductive storage coils (secondary windings) 222, 224, 226, and 228, fitted around the periphery of a stator of the machine 210. The secondary windings 222-228 serve to function in the XRAM switching circuit for the current multiplication. There are also external polyphase line-to-line short-circuit switches S1 and S2 (reference numbers 236 and 238) on the stator main winding terminals. When the switches S1 and S2 (reference numbers 236 and 238) are closed, this reduces the impedance of the pulsed secondary windings 222-228. The two magnetic circuits on the stator are functionally decoupled in actual operation since the main and XRAM windings are in use at separate times although share a common magnetic circuit.

The synchronous machine may be a permanent magnet (PM) field electrical generator or may be a DC-excited field machine with a wound rotor. The main stator windings 212-216 are excited at constant rotor flux by the PM system. Output is used after AC/DC rectification (in a rectifier 232), and after capacitive storage capacitor intermediate storage 230, to inductively charge the "N" (e.g. 4) storage coils 222-228. The coils 222-228 are charged in series connection with DC current. When the inductors $Ls_1$-$Ls_4$ (the secondary coils 222-228) reach the steady state value of current, the switches 236 and 238 are closed, shorting the main stator output and causing the rotor flux to shift spatially in the airgap by about 90 electrical degrees within a few milliseconds. Although the rotor flux remains about constant, it is now concentrated amongst the inductive storage coils 222-228. The effective magnetic permeance and effective impedance of the main stator winding decreases rapidly when the stator short circuit occurs, the magnetic steel is now in a saturation region and the overall terminal impedance of the main stator coils becomes lower. This shifting of radial airgap flux results in a transient component of direct current being induced into the storage coils and enhancing the overall current output multiplication beyond a simple N stage multiplication. The load switch thyristor $Th_L$ (reference number 280) is closed and all "N" storage coils (the secondary coils 222-228 in the illustrated embodiment) are reconfigured in parallel and output current has been multiplied by a factor of greater than N:1.

A diode $D_{13}$ (reference number 242) protects the rectifier 232 from reverse voltage transients, and ensures that when an air-blast breaker 240 opens, that the current $I_1$ is maintained. A flywheel 250 is operatively coupled to the machine 210.

Figure 4:
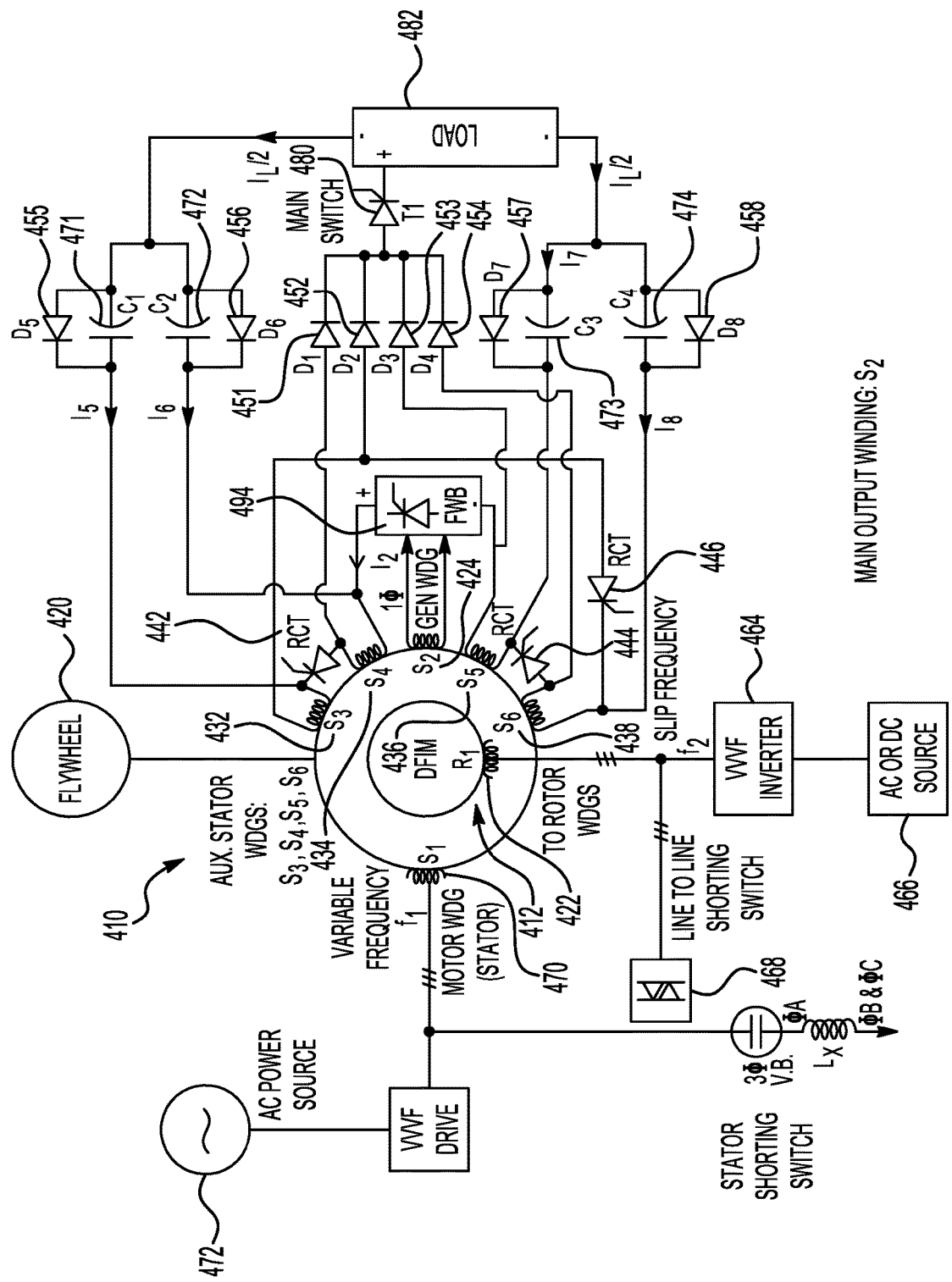
FIG. 4 is a schematic diagram of a power transfer system or machine in accordance with an embodiment of the invention.

FIG. 4 shows a further embodiment, a machine 410 that uses inductive storage for the XRAM generator, and also advantageously uses a set of wound polyphase stator coils placed within the doubly-fed induction electrical machine (DFIM) 410 to store XRAM energy. This arrangement avoids having to use external discrete coils for the XRAM. The machine 410 has a rotor 412 and a stator 414. The rotor 412 has a rotor winding R1 (reference number 422). The stator 414 has a main stator winding S2 (reference number 424), and a series of auxiliary windings S3, S4, S5, and S6 (reference numbers 432, 434, 436, and 438).

FIG. 4 shows three reverse conducting thyristor (RCT) switching devices 442, 444, and 446 external to the machine 410, and eight power diodes D1-D8 (reference numbers 451, 452, 453, 454, 455, 456, 457, and 458) to place the machine coils 432-438 in parallel for creation of a high current pulsed output. The main output thyristor is a unidirectional switching device $T_1$ (reference number 480). The DFIM 410 has the wound polyphase rotor (winding $R_1$, reference number 422) that is excited by a variable-voltage variable-frequency power supply (VVVF inverter) 464, which is fed from either a DC or AC auxiliary power source 466. The rotor excitation also contains a polyphase shorting switch 468 that completely short circuits the rotor circuit 412 at its terminals, so as to enable the XRAM mode. The main power is supplied to the DFIM through the stator motoring winding S1 (reference number 470) from a machine, such as a turbogenerator 472. The DFIM 410 is mechanically connected to a flywheel energy storage device 420 that contains kinetic energy E1. Shaft speed/energy decrement/increment of DFIM is part of the normal operation.

The main DFIM output winding 424 is designated S2 in the illustration, and as shown in drawing is a single-phase stator winding as part of an overall polyphase system. The special XRAM coils on the DFIM stator (for one phase) are designated as same-phase S3, S4, S5 and S6 coils (reference numbers 432, 434, 436, and 438) and are directly connected to switching circuitry (reference numbers 442-446), and to a full wave bridge (FWB) main rectifier 494, which supplies the DC charging current I2. The coils S3, S4, S5 and S6 (432-438) are wound on the same machine stator magnetic circuit as the main motoring/generating coils (424), and utilize the machine main airgap flux yet only during a short period of time. In normal generating operation, the rotor is excited by the VVVF supply 464, and initiates the main airgap flux of the machine 410. The reverse conducting thyristors (RCT) 442-446 connects these four coils 432-438 in series prior to the short circuit mode.

For pulsed power operation, once the main output DC current is rectified and current is circulated into coils S2-S6, the rotor is short circuited which shifts the majority of airgap flux into the coils S2-S6 which boosts this current. Furthermore, upon a rotor short circuit the inductive reactance of coils S2-S6 significantly decreases to what is known as a "bore reactance" which permits high currents to flow with lower reactance. The counter-pulse current I5-I8 provided by electrostatic capacitors C1-C4 (reference numbers 471, 472, 473, and 474) turns OFF the RCT switches 442-446 and the circuit is reconfigured so that Coils S2-S6 are now in parallel to feed the common load. Main output switch 480 combines component currents in the diodes 451-454 into a common load 482. The electrostatic capacitors C1-C4 are smaller energy storage devices and the majority of energy storage is from the coils S2-S6 within the electrical machine. The system is compact and advantageously represents a significant reduction in weight and size in comparison with prior approaches.

Figure 5:
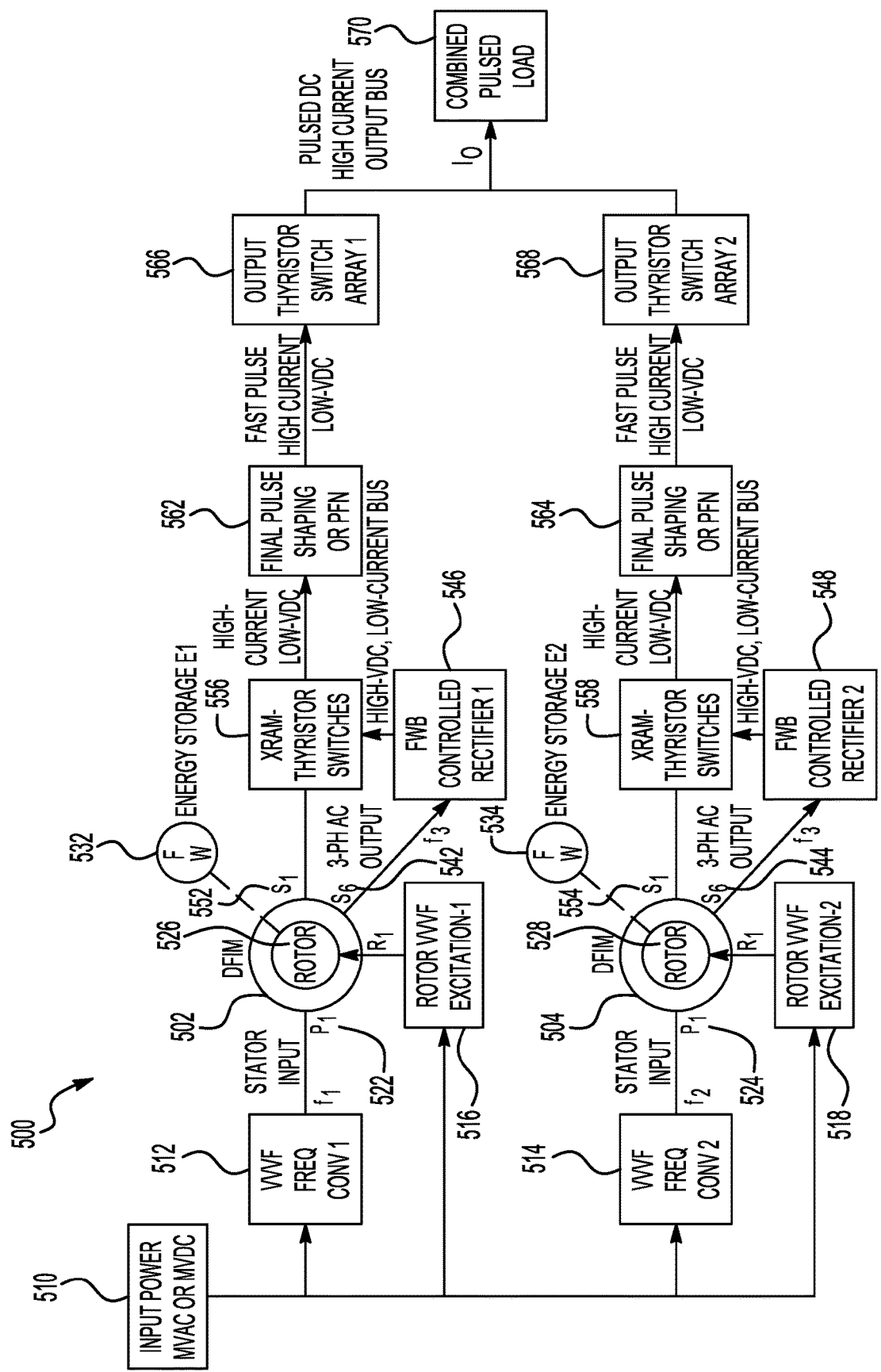
FIG. 5 is a schematic diagram of a stator winding layout in accordance with an embodiment of the invention.

FIG. 5 shows a system 500 which includes a pair of low-current DFIMs 502 and 504, which may be similar to the doubly-fed machine described above in FIG. 4. Input power 510 may be provided to respective frequency converters 512 and 514, and to respective rotor VVVF excitation converters 516 and 518. The main frequency converters 512 and 514 provide power to respective stator inputs 522 and 524, and the converters 516 and 518 provide excitation power to respective rotors 526 and 528. Flywheel energy storage systems 532 and 534 are also coupled to the respective rotors 526 and 528. Stator output main coils 542 and 544 are coupled to respective full-wave-bridge controlled rectifiers 546 and 548. Secondary output coils 552 and 554 are coupled to respective XRAM-thyristor switch networks 556 and 558. Output then goes through respective final pulse shaping networks (PSNs) or pulse forming networks (PFNs) in blocks 562 and 564, then on through respective output thyristor switch arrays 566 and 568, and then out to a pulsed load 570.

Figure 6:
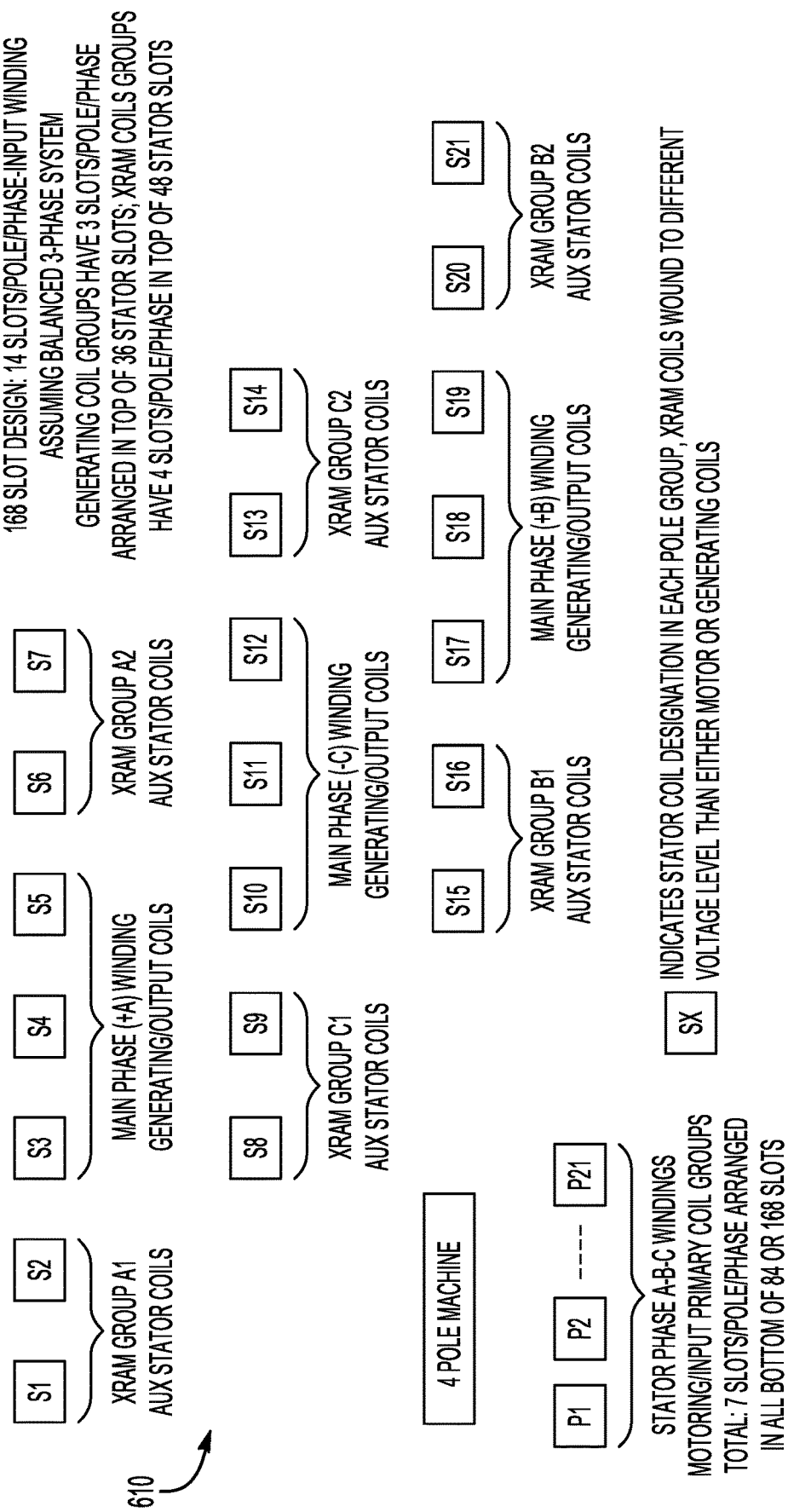
FIG. 6 is a schematic diagram of a power transfer system or machine in accordance with an embodiment of the invention.

FIG. 6 shows another embodiment, an electrical machine 610 with a four-stage XRAM showing the arrangement of three phases around the stator periphery of the electrical machine 610, for example with either 84 or 168 total stator slots. The machine 610 is a DFIM machine with four poles. Main output windings are in tops of stator slots: 72 slots as 3-phases, 6 slots per pole per phase arranged as 3 separate groups double-layer lap winding each having 2 slots/pole. Main motoring windings are in bottom of stator slots: 84 coils for a 3-phase system, 21 coils per phase, 7 coils per pole per phase, as a lap wound double-layer winding. For the XRAM coils there are a total of 12 coils in a 3-phase system spaced equally around stator periphery embedded in stator slots closest to airgap. In the machine 610 the rotor winding is 4 pole wound as "skip pole" delta connected winding in typically 36 or 72 slots.

Figure 7:
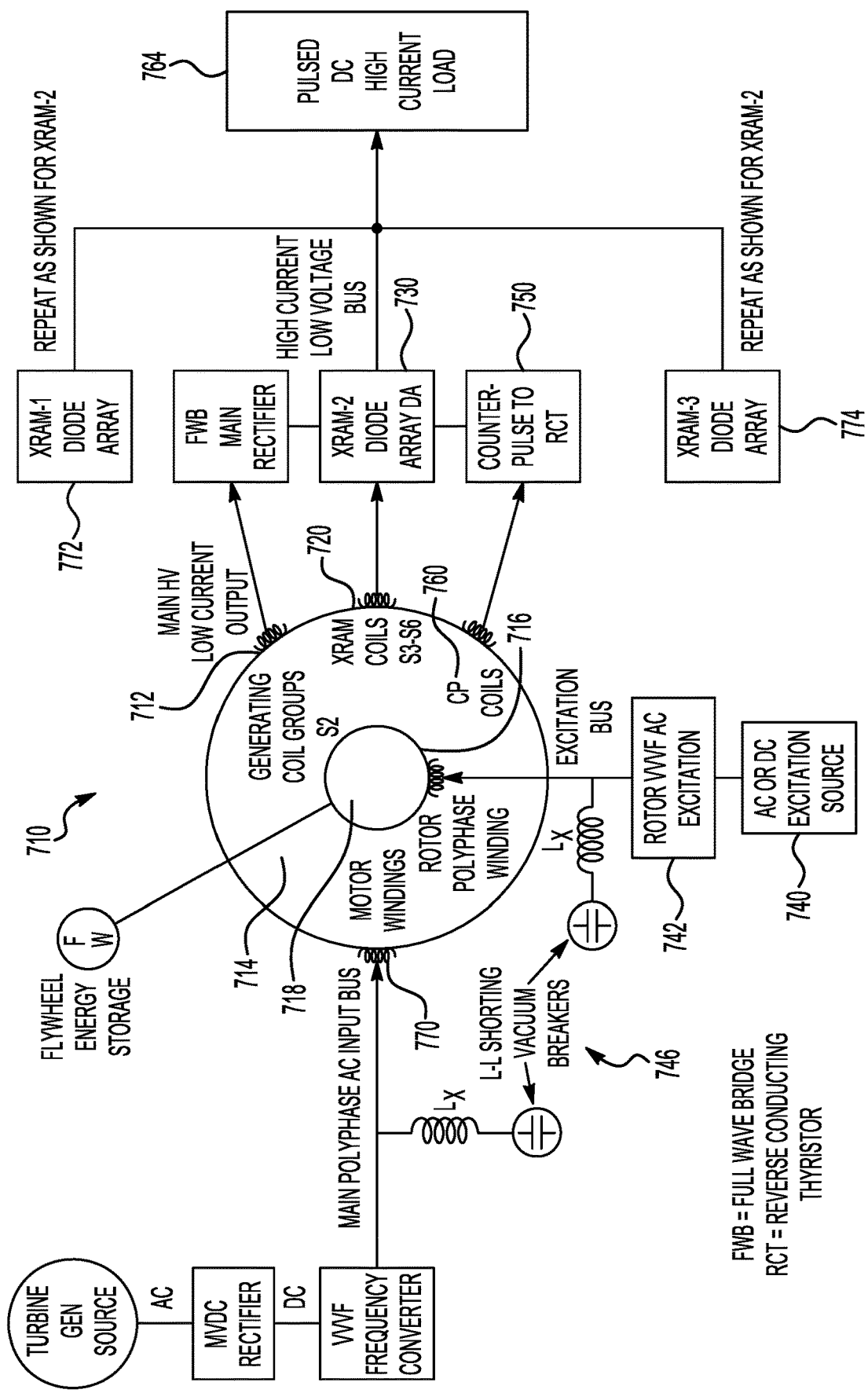
FIG. 7 is a schematic diagram of a power transfer system or machine in accordance with an embodiment of the invention.

FIG. 7 shows an embodiment of a machine 710 where the XRAM (N=4) external storage inductors are eliminated by having the electrical machine provide the magnetic flux to link these inductors to main airgap flux and create a magneto-inductive storage for XRAM coils S3, S4, S5 and S6 (collectively reference number 720). Diodes in some prior arrangements are also eliminated, leaving only four full-wave-bridge power diode assemblies for a four-stage XRAM, shown as an XRAM diode array 730. RCT switching devices are used when very high currents such as 10,000 Amps are involved; otherwise a lower current solid-state switching device such as an IGBT or MOSFET which can commutate its own current by gate turn-off command can be effectively used. In FIG. 7, the coils S2-S6 (a stator main AC output 712 and the XRAM coils 720) are wound on the electrical machine stator core 714 and respond to a sudden short circuit of the rotor circuit R1 (reference number 716) on a rotor 718. An AC or DC excitation source 740 and a VVVF excitation inverter 742 provide power to the rotor circuit R1 (reference number 716). After the excitation source 740 is shut off and when system ready for a high current discharge, the rotor circuit R1 (reference number 716) is short circuited through a line-to-line electronic switch (such as an anti-parallel thyristor combination) 746, which peripherally shifts airgap flux into the stator generating coil 712, or the XRAM coils 720. This consequent shifting of the airgap radial magnetic flux is not nulled but rather accumulates in the XRAM dedicated coils or sector and so reduces their inductive reactance, which is advantageous for creating high output current. In certain machine winding layouts, it is also beneficial to short-circuit the stator motoring winding 770 after machine 710 is up to speed as shown with the two 3-phase vacuum breakers VB and the shorting inductor Lx (collectively reference number 746) connected as line to line. Simultaneously the rotor winding R1 (716) and stator winding S1 (712) short circuiting mode results in a high voltage induction into the S2-S6 coils (XRAM coils 722-728) which is used to reverse bias the set of RCT thyristors 750. The coils S2-S6 are placed closest to the machine airgap to react most effectively with the shifting of stator airgap flux.

In the embodiment shown in FIG. 7 the counter-pulse capacitors in the embodiment of FIG. 4 (for example) are eliminated by having the electrical machine auxiliary output winding 760 provide the counter-pulse current to effect a commutation of the three RCT thyristor switches 750. The machine counter-pulse circuits CP 760 are connected directly across each RCT. RCT switching devices may be used when very high currents such as 10,000 Amps are involved. Otherwise a lower current solid-state switching device such as an IGBT or MOSFET, which can commutate its own current by gate turn-off command, can be effectively used. In FIG. 7, the coils S3-S6 (stator XRAM coils 720) and counter pulse coils 760 are wound on the common electrical machine stator core and respond (by having high induced voltage) to a sudden short circuit of the rotor circuit. The rotor circuit R1, after excitation inverter VVVF is shut off and when system is ready for a high current discharge, is then short-circuited through a line to line electronic switch (or vacuum breakers) 746 which peripherally shifts airgap flux into the stator generating, CP and XRAM coils.

The machine 710 is linked to a pulsed DC load 764 through diode array 730. Other similar machines, represented in FIG. 7 by XRAM diode arrays 772 and 774, also may be coupled (such as in parallel) to provide power to the load 764.

The special electrical induction machine has an internal space transient effect which produces a non-symmetrical distribution of flux around the airgap periphery in contrast to normal operation where airgap flux is symmetrically distributed. This non-symmetrical distribution of flux is advantageous.

Figure 8:
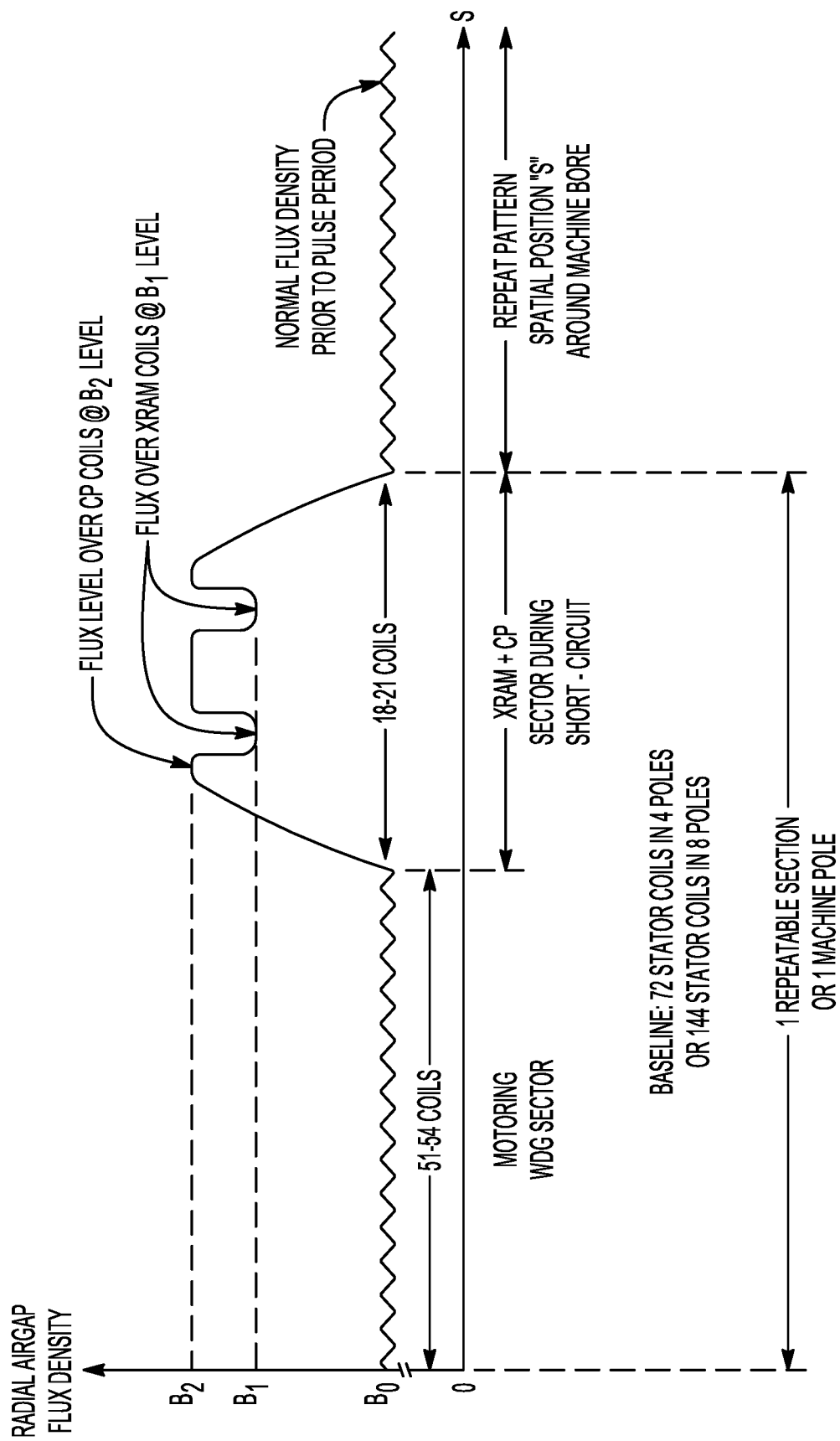
FIG. 8 is a graph qualitatively illustrating changes in airgap flux level during operation of a machine according to an embodiment of the invention.

FIG. 8 shows a spatial distribution of airgap flux when a segment of the machine stator periphery is occupied by a combination of a motoring or generating winding and a specific peripheral sector devoted to both XRAM coil and counter-pulse coils in a 72 or 144 slot stator of 4 or 8 poles respectively. The normal flux density for the motoring winding $B_0$ may be 0.70 Tesla, the XRAM flux density $B_1$ may be 0.85 Tesla and the counter-pulse airgap flux density $B_2$ at 0.95 Tesla. These two higher flux densities are a function of short circuiting the motoring winding at its terminals which cause a shifting of the airgap magnetic flux out of the motoring zone and into the XRAM zones. This is a form of flux compression. That is the flux that would normally encircle 54 slots is squeezed into a zone of 18 slots causing an inherent 4:1 flux compression if the short circuit were perfect. Since there is a leakage inductance in the motoring winding and the short circuit current is limited by the stator to rotor leakage reactance and the end-winding leakage, the inherent flux compression might be a 2:1 ratio which is acceptable. Here it is sent the XRAM and CP coil sector occupies 18 slots out of 72 slots, or 25% of the machine periphery. In an alternate embodiment, the XRAM and CP coils occupy 9 slots out of 72 slots, or 12.5% of the machine periphery which is more efficient.

Figure 10:
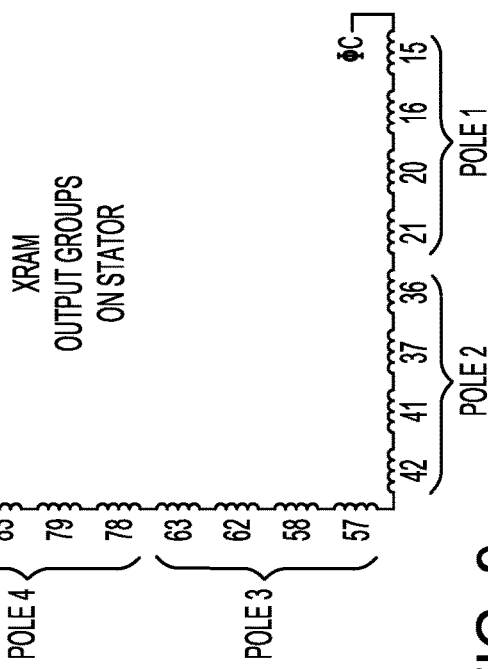
FIG. 10 is a winding diagram illustrating an example motor winding according to the same embodiment as FIG. 9's winding.
Figure 9:
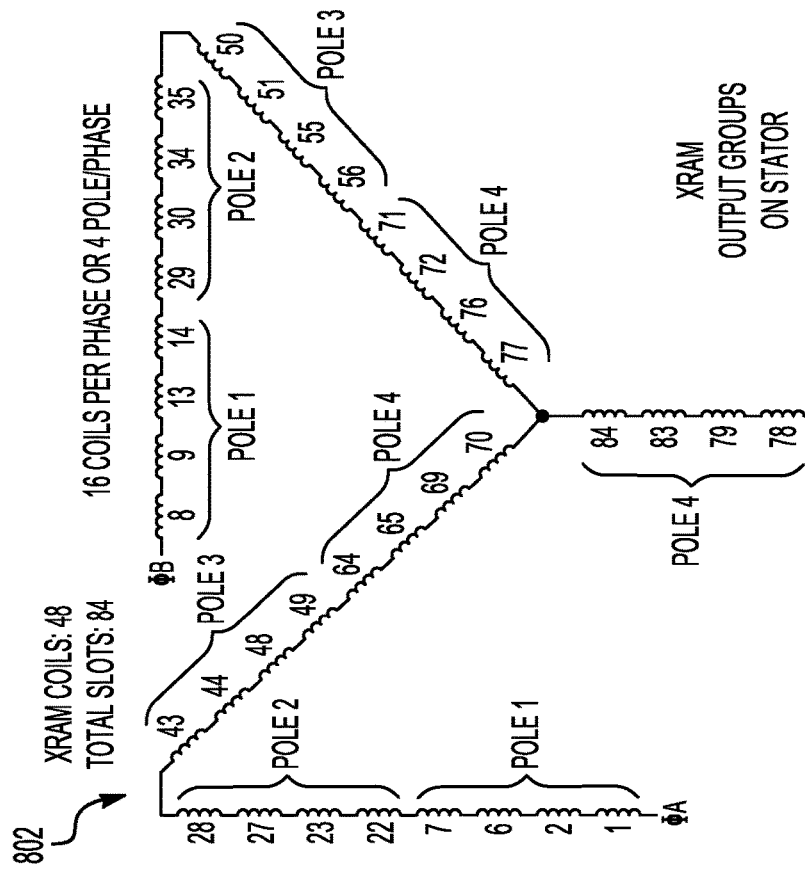
FIG. 9 is a winding diagram illustrating an example XRAM coil winding according to an embodiment of the invention, part of a machine that includes the windings shown in FIGS. 10 and 11.
Figures 11, 12:
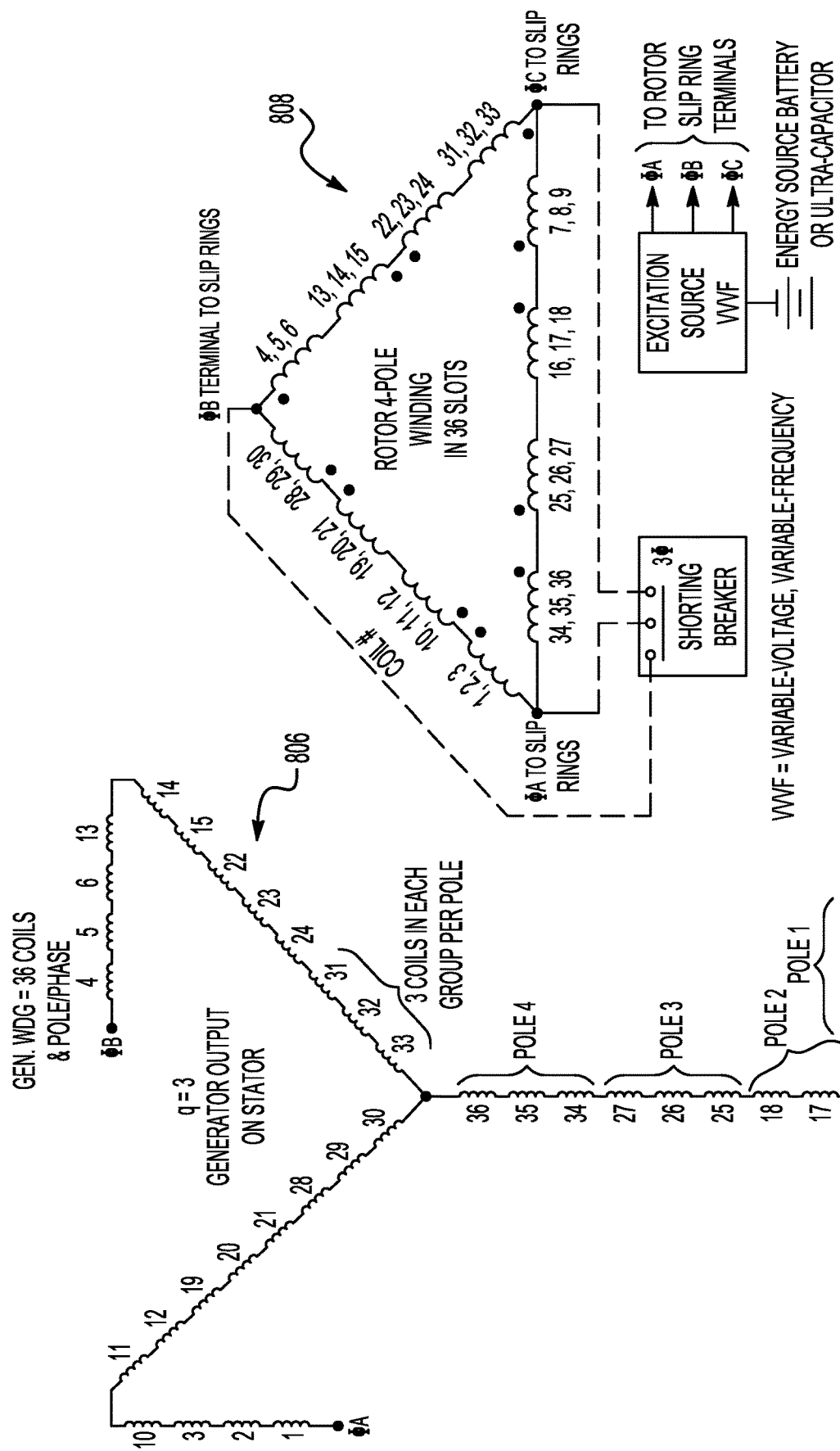
FIG. 11 is a winding diagram illustrating an example generator winding according to the same embodiment as FIG. 9's winding.
FIG. 12 is a winding diagram illustrating an example rotor winding according to the same embodiment as FIG. 9's winding.

FIGS. 9-12 shows an example electrical machine coil system. FIGS. 9-11 show sample layouts of a 4-pole 3-phase machine in 84 stator slots showing coil groups for (respectively) XRAM winding (layout 802 in FIG. 9), motoring winding (layout 804 in FIG. 10), and generator winding (layout 806 in FIG. 11) on a common frame. The XRAM winding has 48 coils, the motoring winding has 84 coils and the generating winding has 36 coils. Thus each stator winding can have unique voltage levels and unique power input/output levels. FIG. 12 shows preferred rotor winding layout 808 for a 4-pole DFIM machine in 36 rotor slots to match the stator top drawing. The winding layout can be extended to other pole numbers such as 6, 8 and 10 poles with stator slot numbers starting at 72. The rotor can be excited by a slip-ring assembly or by a brushless exciter, as is well known in the art.

Figure 13:
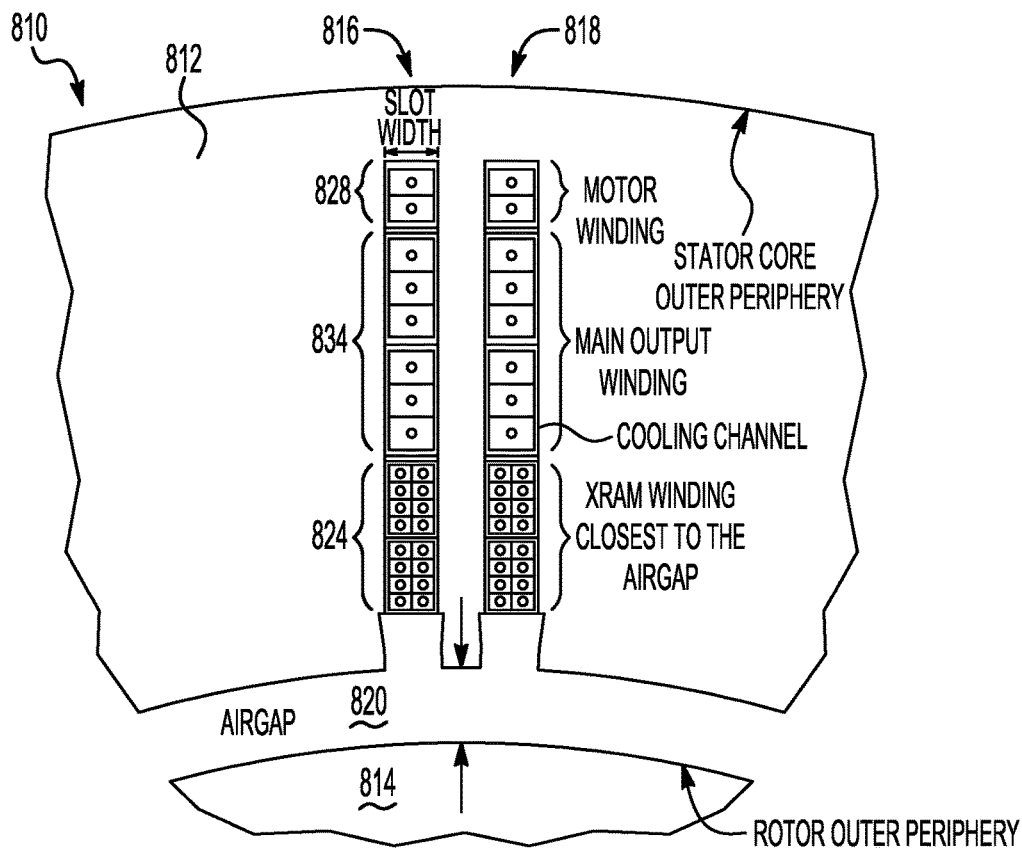
FIG. 13 is a cross-sectional view showing windings in a stator according to an embodiment of the invention.
Figure 14:
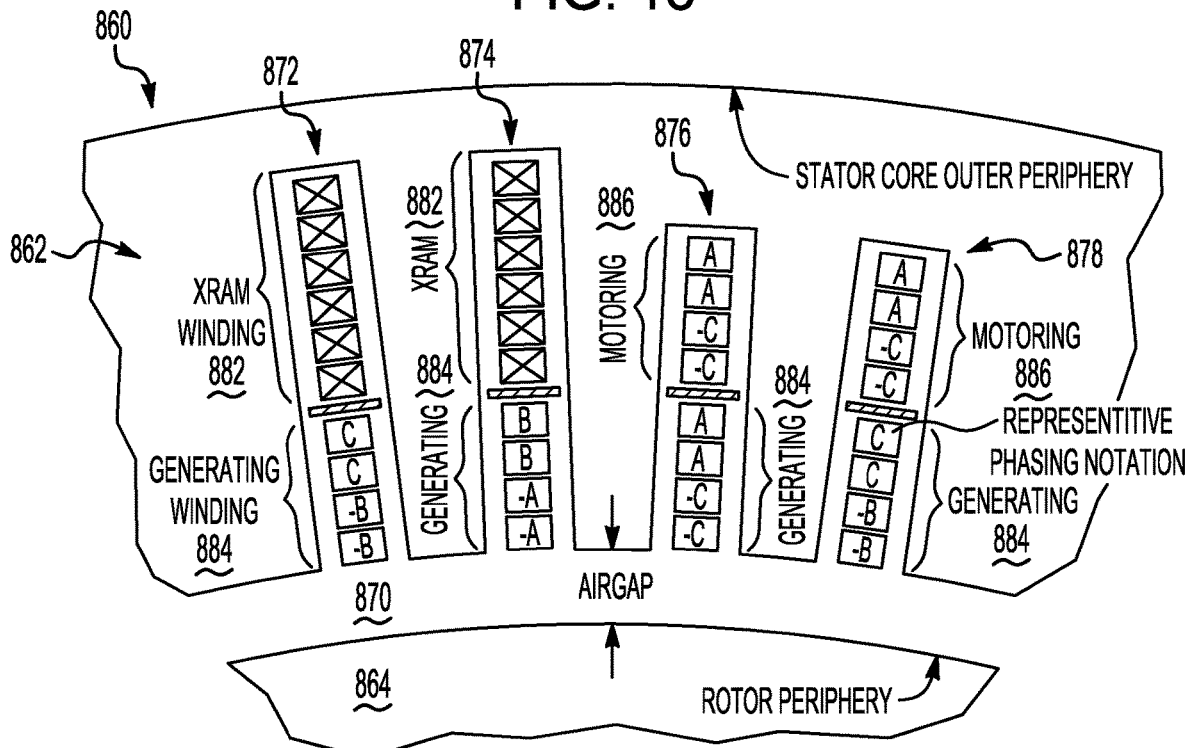
FIG. 14 is a cross-sectional view showing windings in a stator according to an embodiment of the invention.
Figure 15:
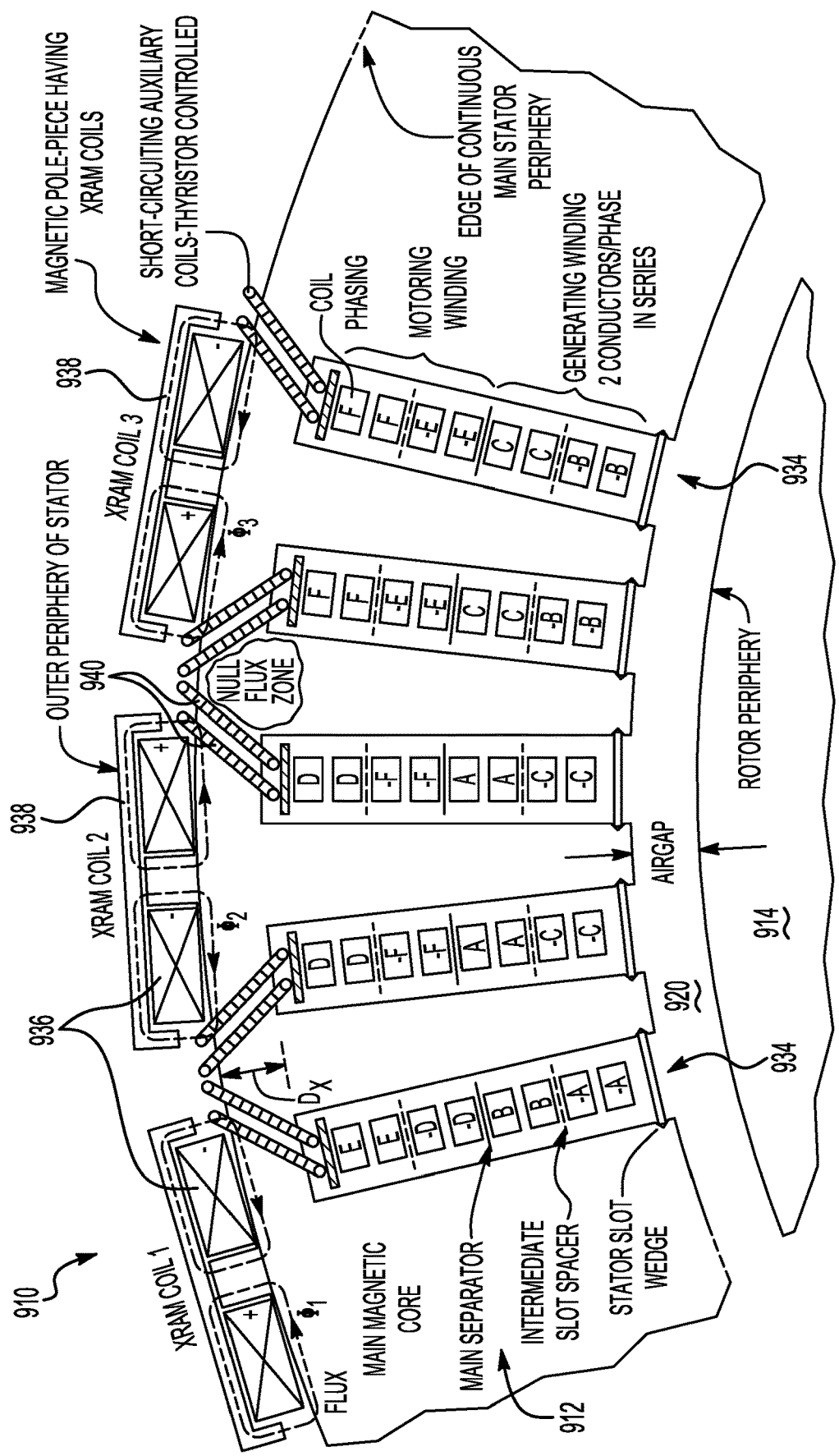
FIG. 15 is a cross-sectional view showing windings in a stator according to an embodiment of the invention.

FIGS. 13-15 shows three different cross sections of stator slots showing three types of configurations for implementing XRAM windings on the stator frame. The arrangements shown in FIGS. 13-15 may be used as part or in connection with other aspects of the various other embodiments shown therein.

FIG. 13 shows an approach of combining an XRAM winding into same slot as the generating and motoring windings shown as 2 slots/pole/phase, in a machine 810 having a stator 812. The stator 812 surrounds a rotor 814, and the stator 812 has slots 816 and 818 for receiving the various windings. Only the two slots 816 and 818 are shown in FIG. 13 but it will be appreciated that the stator 812 may have slots evenly circumferentially spaced around the stator 812. The stator 812 and the rotor 814 define an airgap 820 between them, with the airgap 820 radially inward of the stator 812 and radially outward of the rotor 814. An XRAM winding 824 is located in the slots 816 and 818 closest to the airgap 820 to minimize magnetic permeance and minimize magnetic reactance. A motoring winding 828 deepest in the slots 816 and 818, yielding a highest magnetic permeance/reactance of the group. A main output winding 834 is in the slots 816 and 818, radially between the XRAM winding 824 and the motoring winding 828. All the windings 824, 828, and 834 are shown in FIG. 13 with internal liquid cooling conductor channels. However it will be appreciated that other sorts of conductor cooling may be used instead.

FIG. 14 shows a cross section of a stator 862 of a machine 860. The stator 862 surrounds a rotor 864, with an airgap 870 between the rotor 864 and the stator 862. Various windings of the machine 860 are located in slots 872, 874, 876, and 878 of the stator 862. The windings include XRAM windings 882 that are located in the deepest part of the stator slots 872 and 874. The windings 882 are only located in select slots (e.g., the slots 872 and 874) that are shared with a generating winding 884, and not with a motoring winding 886. The motoring winding 886 is confined to slots, such as the slots 876 and 878, where the XRAM windings 882 are not located. Most of the machine stator periphery 860 is wound with a combination of generating and motoring windings in a common stator slot, and only a small portion of the machine's stator has the combined XRAM and generating windings in common slots. The arrangement for the generating and motor windings can be standard 2-6 slots/pole/phase layout whereas the XRAM winding will generally have a lower number of occupied slots resulting in 1-2 slots/pole/phase. In the configuration shown in FIG. 14 the method of shorting at the terminals of either the motoring or generating winding (or both) will result in a peripheral shifting of the magnetic flux in the stator core and concentrate this flux around the XRAM windings 882, inducing an electro-magnetic field (EMF) that will result in high voltage generation in the XRAM coils 882.

Here using a larger number of turns (e.g. 6 per slot) for the XRAM winding results in a higher voltage induced in the XRAM winding than would be the applied voltage to the motoring winding or the output of the generating winding during a short circuit condition. In addition the larger number of turns for the XRAM winding results in a higher terminal inductance than the generating winding; this inductance L is necessary as an energy storage device since stored energy $E=0.5*L*I^2$. The current I that is induced is proportional to the short circuit current of the combined motoring and generating winding when this mode of operation occurs.

FIG. 15 shows an embodiment of a machine 910 with a stator 912 surrounding a rotor 914 with an airgap 920 there between. In the machine 910 XRAM coils 936 are positioned outside of the standard machine slots 934. The XRAM coils 936 have dedicated locations and dedicated magnetic pole pieces 938 positioned along the outer part of the magnetic core of the stator 912. The magnetic pole pieces 938 are used to confine XRAM magnetics to a specific flux path and increase energy storage of a coil. Special null flux shorting coils 940 are located in select stator slots 936 and enclose the magnetic core back-iron flux to control flux density in the radial dimension shown in FIG. 15 as D. Magnetic flux lines $\varphi 1$, $\varphi 2$, $\varphi 3$ enclose the XRAM coils 936 and develop both voltage and inductance of the XRAM coils 936. In normal operation, prior to a pulse duty, the fluxes $\varphi 1$, $\varphi 2$, $\varphi 3$ are at a nominal value. When a pulse duty is being commanded, the array of shorting coils 940 are shorted through an electronic switch (e.g., a thyristor or IGBT) and the magnetic flux $\varphi 1$, $\varphi 2$, $\varphi 3$ rapidly increases, and the XRAM output current correspondingly rapidly increases and is able to store energy. In an embodiment each of the shorting coils has its own shorting electronic switch rather than having multiple shorting coils in series connection.

The machine 910 may be a DFIM, as is discussed below in connection of the system shown in FIG. 16. Alternatively the machine 910 may be another type of rotating electrical machine, including synchronous or reluctance types.

Figure 16:
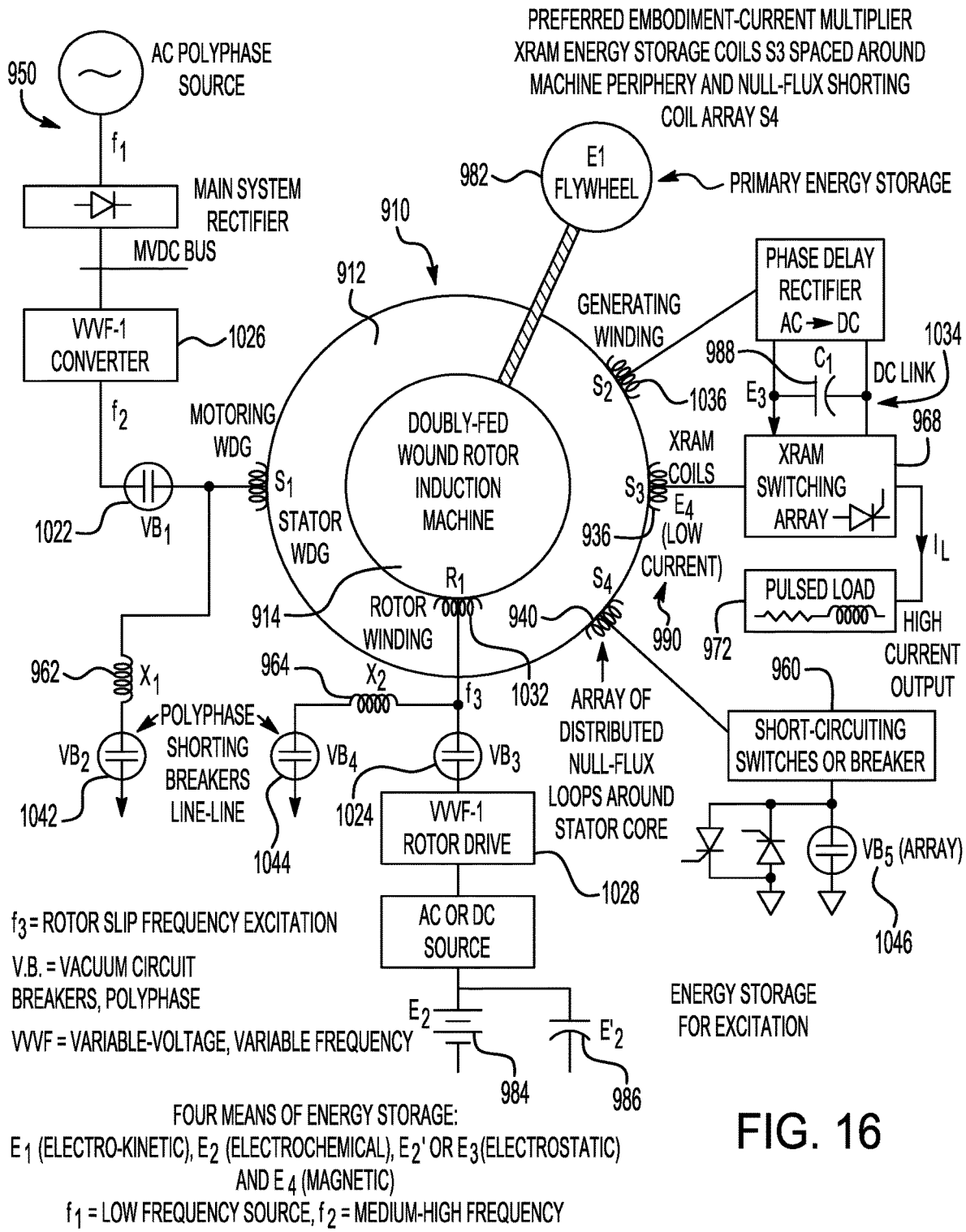
FIG. 16 is a schematic diagram of a power transfer system that includes the machine of FIG. 15.

FIG. 16 shows a system 950 that includes the machine 910 of FIG. 15. FIG. 16 shows an apparatus 1046 to short-circuit the null flux loops shown in FIG. 15, which causes flux circulating around the XRAM coils to decrease. The machine 910 shown in FIG. 16 is a DFIM. The XRAM current multiplier scheme includes the XRAM coils 936, and the null flux coils 940 around the stator core 912, as described above. The machine 910 also includes short circuiting switches 960 on three null-flux loop windings to concentrate machine flux in XRAM storage coils 936 and result in high current output. Reactors X1 and X2 (reference numbers 962 and 964) are used to limit short-circuit current to safe values. Generating winding 1036 is rectified and filtered at DC link 1034, then fed into XRAM switching array 968. The XRAM electronic switching array 968 is used to create a high current output pulse, in a manner similar to that described above with regard to the embodiments shown in FIGS. 3 and 4. The switching array 968 provides current $I_L$ to a pulsed load 972, through a switching circuit described further below. There are four types of energy storage as indicated: an electro-kinetic-flywheel E1 (reference number 982), an electrochemical excitation energy source E2 (reference number 984), electrostatic energy sources E2' and E3 (reference numbers 986 and 988) and an electromagnetic-XRAM source E4 (reference number 990).

Figure 17:
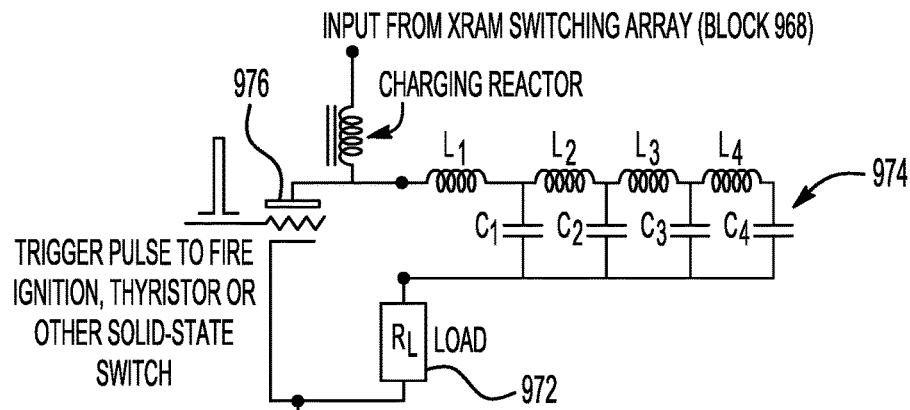
FIG. 17 shows a schematic diagram of a pulsed load circuit that is part of the power transfer system of FIG. 16.

FIG. 17 shows a specialized load circuit 974 for the pulsed load 972, coupled to the XRAM switching array 968 (FIG. 16). The circuit 974 consists of an inductor-capacitor 4-stage pulse forming network. The XRAM switching array 968 provides current multiplication and the PFN load circuit 974 can provide a lower output impedance and a faster rise time e.g. 20 nS than the XRAM into the final load 972, which is shown as resistive element $R_L$. It is a preferred embodiment to have an XRAM high current circuit feed a pulse forming network, such as the circuit or PFN 974, since effective pulse shaping often can require two different types of circuits working in conjunction. A trigger gate pulse 976 shown is provided to any number of high current switching devices such as ignitrons, thyristors, thyratrons, or IGBTs.

Figure 18:
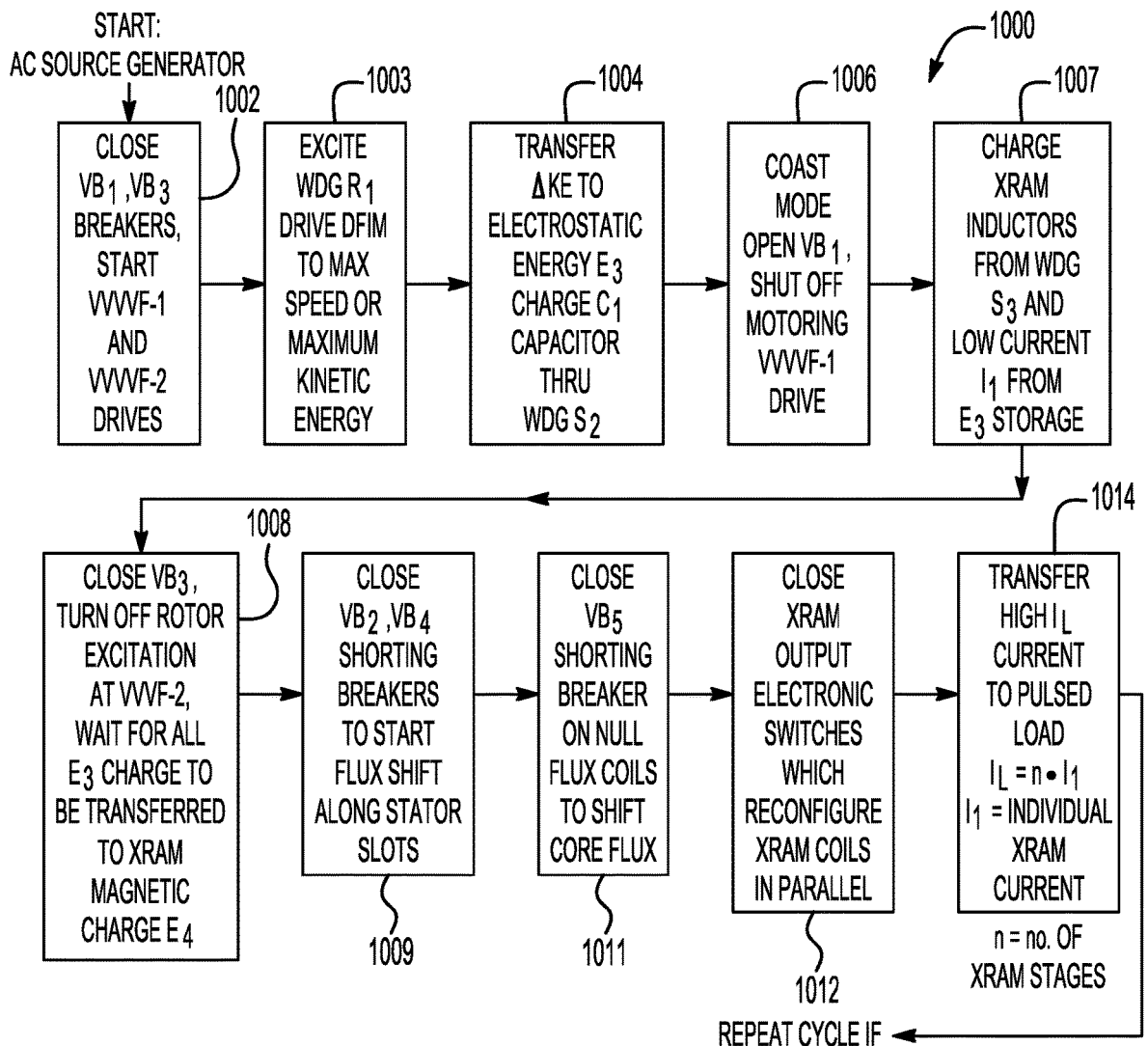
FIG. 18 is a flow chart illustrating steps in the operation of the system of FIG. 16.

FIG. 18 shows the sequence of operation of the system 950 (FIG. 16) with its five vacuum breakers or similar electronic switches (such as bilateral thyristor pairs), three switches or circuit breakers of which are used for creating short circuiting conditions to shift electrical machine flux within the machine stator core causing buildup of magnetic flux surrounding the XRAM coils and thereby produce an increase in coil inductive stored energy. The method 1000 begins in step 1002, with when vacuum breakers $VB_1$ and $VB_3$ (reference numbers 1022 and 1024 in FIG. 16) are closed, and VVVF-1 and VVVVF-2 inverter drives (reference numbers 1026 and 1028 in FIG. 16) are started.

In step 1003 a rotor winding R1 (reference number 1032 in FIG. 16) is excited to drive the DFIM 910 (FIG. 16) to a maximum speed and a maximum kinetic energy. Then, in step 1004, there is a transfer of kinetic energy to the electrostatic energy source E3 (reference number 988 in FIG. 16), charging a capacitor C1 (reference number 1034 in FIG. 16) through a generating winding S2 (reference number 1036 in FIG. 16).

In step 1006 the system 950 (FIG. 16) enters into a flywheel coast mode, with the breaker $VB_1$ (1022) opened, and the VVVF-1 motoring drive 1026 shut off. In step 1007 the XRAM inductors (parts of the XRAM switching array 968 (FIG. 16)) are charged, through the XRAM windings S3 (the XRAM coils 936 of FIG. 16) and from a low current originating from the electrostatic energy source E3 (reference number 988 in FIG. 16).

In step 1008 the rotor circuit vacuum breaker $VB_3$ (reference number 1024 in FIG. 16) is opened, and the rotor excitation is turned off at the VVVF-2 motoring drive 1028, hereby waiting for all of the electrostatic charge to be transferred from the electrostatic energy source E3 (reference number 988 in FIG. 16) to the XRAM switching array E4 (reference number 990 of FIG. 16). Following that, in step 1009, shorting vacuum breakers $VB_2$ and $VB_4$ (reference numbers 1042 and 1044 in FIG. 16) are closed, to start flux shift along the stator slots 936 (FIG. 15). In step 1011 vacuum breakers $VB_5$ (reference number 1046 in FIG. 16) are closed, shorting the null flux coils 940 (FIG. 15) to shift stator magnetic core flux.

Then in step 1012 the XRAM output electronic switches 960 are closed, to reconfigure the XRAM coils 936 (FIG. 16) in parallel. Finally in step 1014 there is a transfer of the high current (multiplied $I_L$ current) to the pulsed load 972 (FIG. 16). The high current $I_L$ is multiplied by the number n of XRAM coils over the current produced by a single coil $I_1:I_L=n \cdot I_1$. This cycle may be repeated as necessary to provide a continuous stream of high-current pulses as required.

Figure 19:
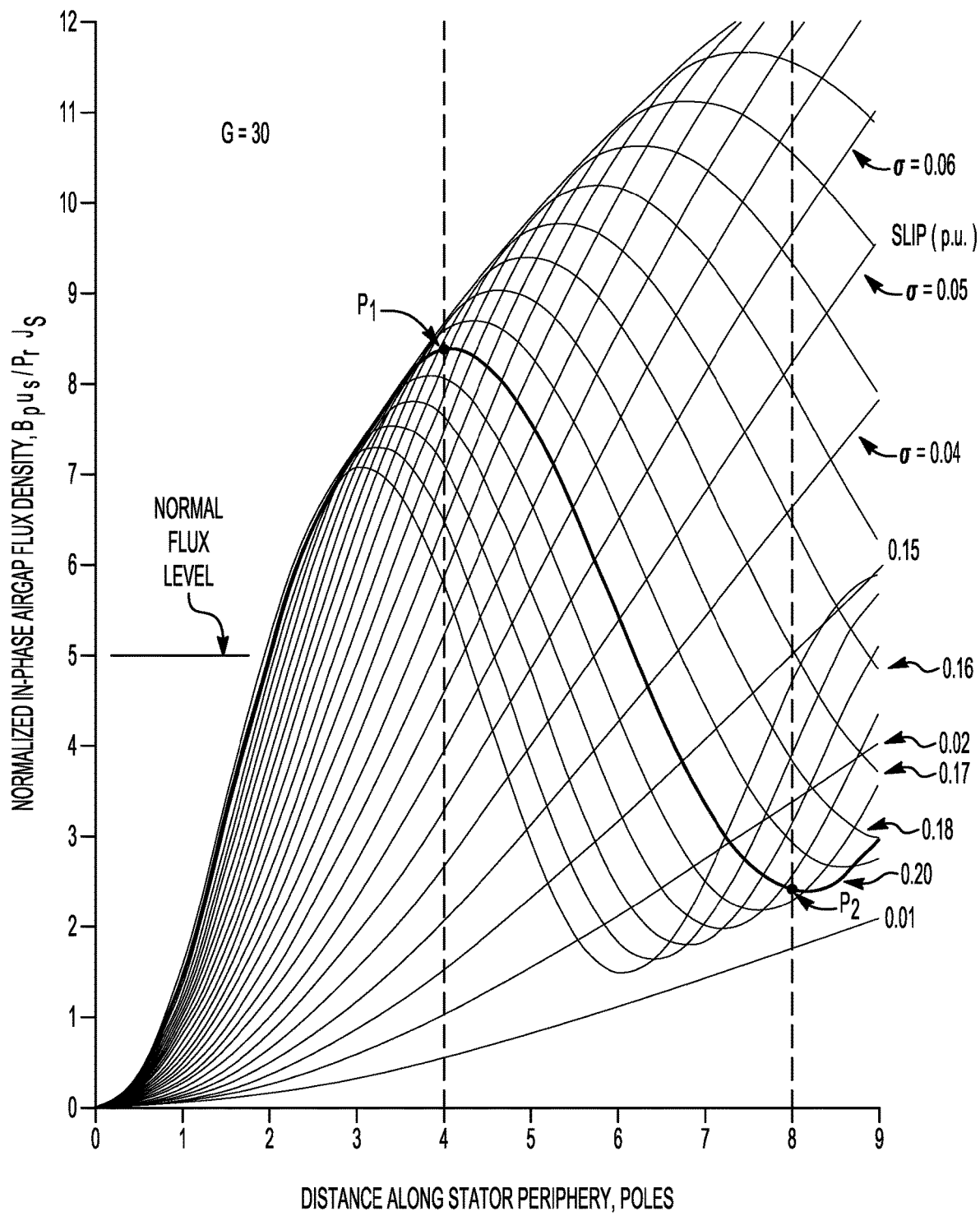
FIG. 19 shows a parametric design curve for an XRAM machine, with a first condition/configuration highlighted.
Figure 20:
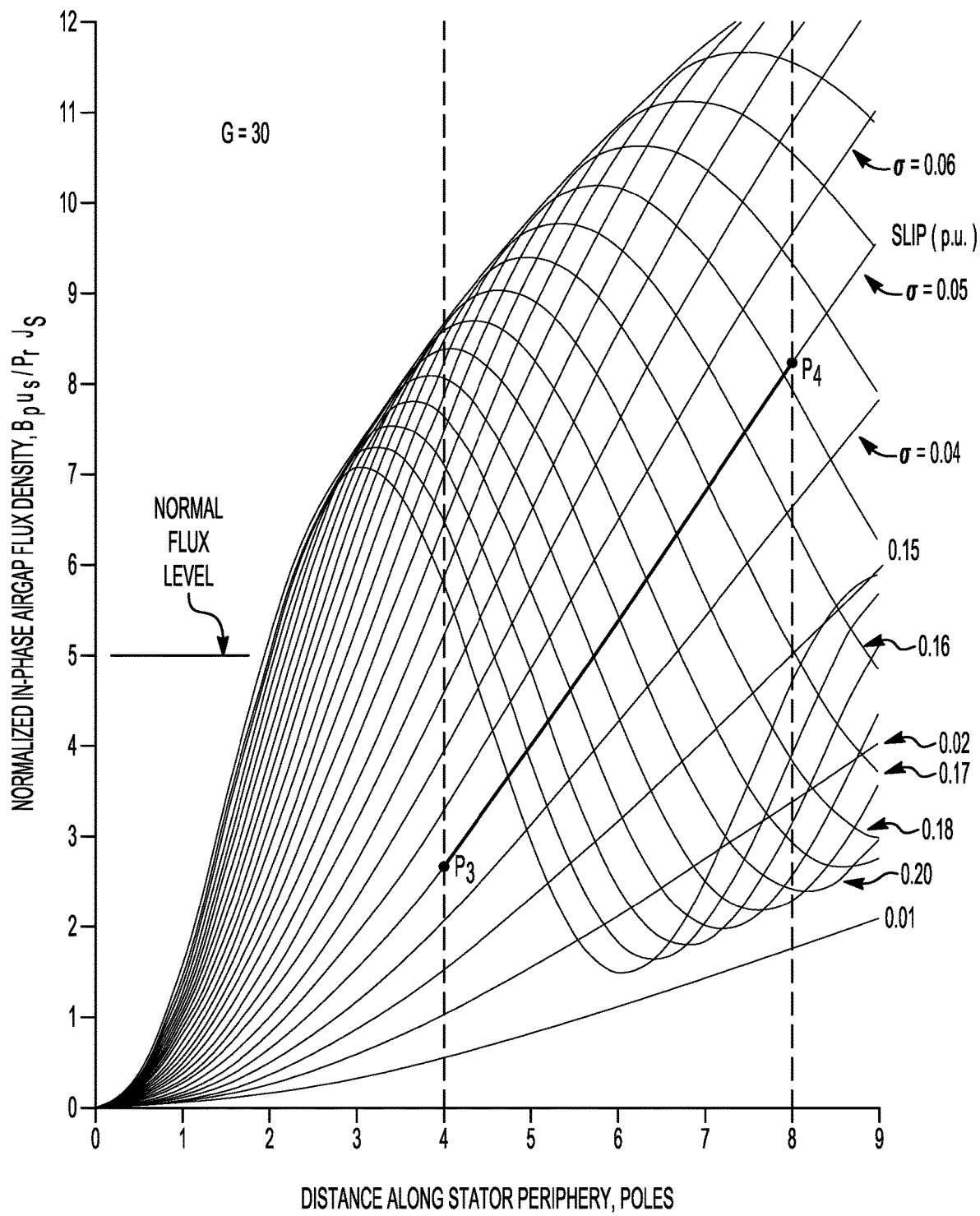
FIG. 20 shows the parametric design curve of FIG. 19, with a second condition/configuration highlighted.

FIGS. 19 and 20 show a parametric design curve for an XRAM machine specific to an induction machine with shorted stator primary coils and non-shorted secondary or tertiary coils. The vertical axis is the normalized product of in-phase flux density times synchronous speed, divided by the product of rotor resistivity times stator current loading. The design parameter G is the ratio of magnetizing reactance $X_m$ to rotor resistance $R_r$ and shown for specific case of G=30, which is representative of a large induction machine. The rotor can be a cage rotor or a wound polyphase rotor. FIGS. 19 and 20 show the airgap radially-directed flux density $B_p$ as a function of airgap peripheral distance for the case when the stator motoring winding (preceding stator pole location zero) is short circuited on all phases, the flux density peak location shifts and the flux density builds up from zero in an oscillatory fashion for the subsequent windings (either secondary or tertiary coils) spaced along the stator. The normal flux density is 5.0 per unit (shown as a straight horizontal line) unit under the condition stator motoring coils are not short circuited and this is a constant airgap flux density over entire periphery. The direct and quadrature axes of the machine are not stationary but rather move in spatial location as a function of slip value. The real electrical torque in Newtons of the generating windings which feeds energy or power to the XRAM coils is the integral of the airgap flux density $B_p$ (in Tesla) times the stator current loading $J_s$ (A/meter periphery). The product of torque times shaft speed in radians/second gives the electrical power generated in Watts. The flux density spatial shifting occurs simultaneously with stator short circuiting.

FIG. 19 specifically highlights a case when electromagnetic slip of the generating winding is held to 20% (0.20 per unit); at point $P_1$ the flux density is 8.37 per unit at pole 4 (termed a Direct Axis) and when the coils are at point $P_2$ the flux density is 2.40 per unit at pole 8 (termed a Quadrature Axis). The difference in flux due to flux shifting is large e.g. using the above numbers a ratio of 3.48:1. Generating coils can be distributed and arranged to be between positions $P_1$ and $P_2$ along the red curve. However it is advantageous to place tertiary or counter-pulse coils at Pole 4 or position $P_1$ to maximize the effects of flux shifting and maximize voltage induction.

FIG. 20 specifically highlights a case when slip of the generating winding is held to 5% (0.05 per unit). At point $P_3$ the flux density is low at 2.64 per unit at pole 4 (a new Quadrature Axis) and when the coils are at point $P_4$ the flux density is higher at 8.25 per unit at pole 8 (now a new Direct Axis). The difference in flux due to flux shifting is now reversed and large e.g. using the above numbers a ratio of 1:3.12. Secondary coils can be distributed and arranged to be between positions $P_3$ and $P_4$ along the red curve. However it is advantageous to place tertiary or counter-pulse coils at position $P_4$, i.e. at Pole 8, to maximize the effects of flux shifting and maximized voltage induction. Thus it is clear that if the electromagnetic slip value of this induction machine can be controlled by either phasing of the rotor currents or by the net torque loading by the machine, the locations of peak and minimum airgap flux density are continuously repeatable and controllable by design.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A dynamo-electric machine comprising:
   an electromagnetic structure that includes:
      alternating current primary windings; and
      polyphase secondary windings; and
   a switching array;
   wherein the primary windings magnetize the dynamo-electric machine;
   wherein the electromagnetic structure provides power to the switching array, with the switching array configured to produce current multiplication for output to an external load.

2. The machine of claim 1, further comprising one or more energy storage devices operatively coupled to the electromagnetic structure.

3. The machine of claim 2, wherein the one or more energy storage devices includes an electro-kinetic energy storage device.

4. The machine of claim 3, wherein the electro-kinetic energy storage device is a flywheel.

5. The machine of claim 4, wherein the flywheel is mechanically connected to the electromagnetic structure.

6. The machine of claim 4, wherein the flywheel is on a same shaft as other elements of the machine.

7. The machine of claim 2, wherein the one or more energy storage devices includes an electrochemical excitation energy source which is bidirectional.

8. The machine of claim 2, wherein the one or more energy storage devices includes an electrostatic energy source which is bidirectional.

9. The machine of claim 2, wherein the one or more energy storage devices includes an electromagnetic source which is bidirectional.

10. The machine of claim 1,
    further comprising tertiary windings operatively coupled to the primary windings and the secondary windings; and
    wherein the tertiary windings provide inductive energy storage.

11. The machine of claim 10, wherein in operation the tertiary windings are configurable in a series connection for energy storage, and are reconfigurable in a parallel connection.

12. The machine of claim 1, further comprising tertiary windings operatively coupled to the primary windings and the secondary windings such that short circuiting of the primary windings or the secondary windings causes a shifting and concentration of a machine airgap flux of the machine over tertiary windings, which induces a direct or transient current in the tertiary windings, which is used for inductive energy storage and to effect a current multiplication to the external load.

13. The machine of claim 12, wherein the short circuiting of the primary windings or the secondary windings causes a shifting or concentration of the machine airgap flux from a direct magnetic axis to a quadrature magnetic axis.

14. The machine of claim 12,
    wherein there are three or more distinct levels of airgap radially-directed magnetic flux over a repeatable section of the airgap periphery, with the primary windings and the secondary windings magnetically coupled by a first level flux density, and the tertiary windings coils coupled by a second level of flux density, and counter-pulse coils that are coupled by a third level of flux density.

15. An alternating-current dynamo-electric machine comprising:
a stator assembly;
a rotor assembly; and
windings in the stator assembly;
wherein the windings in the stator assembly include:
main windings for producing output alternating current; and
pulsed winding coils configured for producing a multiplied output that is greater than the output current of the main windings.

16. The machine of claim 15, wherein the main windings and the pulsed winding coils are in alternate slots of the stator assembly, and drive different respective magnetic circuits.

17. The machine of claim 15, further comprising:
counter-pulse coils on an outer periphery of a stator magnetic core of the stator assembly; and
circuitry coupled to the counter-pulse coils.

18. The machine of claim 15, wherein the pulsed winding coils are positioned outside of slots of the stator magnetic core that contain the main windings.

19. The machine of claim 15, wherein the main windings include generating windings that are operatively coupled to a rectifier to selectively store energy in the pulsed winding coils, to allow selective control of high-current output from the pulsed winding coils.

20. The machine of claim 15, wherein the main windings include generating windings that are operatively coupled to a rectifier to selectively store energy in the pulsed winding coils, to allow high-energy output from the pulsed winding coils to be selected or controlled in discrete steps.

* * * * *